United States Patent
Moriwaki

(10) Patent No.: US 7,449,411 B2
(45) Date of Patent: Nov. 11, 2008

(54) SEMICONDUCTOR DEVICE AND MANUFACTURING METHOD THEREOF, ELECTRO-OPTICAL DEVICE AND MANUFACTURING METHOD THEREOF, AND ELECTRONIC APPARATUS

(75) Inventor: Minoru Moriwaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 304 days.

(21) Appl. No.: 11/110,798

(22) Filed: Apr. 21, 2005

(65) Prior Publication Data

US 2005/0255688 A1 Nov. 17, 2005

(30) Foreign Application Priority Data

May 12, 2004 (JP) .............................. 2004-142619

(51) Int. Cl.
   *H01L 21/4763* (2006.01)
(52) U.S. Cl. ............................... 438/638; 257/E21.577
(58) Field of Classification Search ................ 438/639, 438/976, 638; 257/E21.577
   See application file for complete search history.

(56) References Cited

U.S. PATENT DOCUMENTS

| | | | | |
|---|---|---|---|---|
| 5,362,666 A | * | 11/1994 | Dennison | .................... 438/396 |
| 6,368,957 B1 | * | 4/2002 | Horio | ........................ 438/634 |
| 6,586,794 B2 | | 7/2003 | Nakamura et al. | |
| 6,909,054 B2 | | 6/2005 | Sakamoto et al. | |
| 7,122,463 B2 | | 10/2006 | Ohuchi | |
| 2003/0049920 A1 | | 3/2003 | Koyama | |
| 2004/0053451 A1 | * | 3/2004 | Ono et al. | ..................... 438/151 |
| 2004/0259328 A1 | * | 12/2004 | Ito et al. | ....................... 438/459 |

FOREIGN PATENT DOCUMENTS

| | | |
|---|---|---|
| JP | A-63-003418 | 1/1988 |
| JP | A-09-063989 | 3/1997 |
| JP | A-2001-358212 | 12/2001 |
| JP | A 2002-108244 | 4/2002 |
| JP | A 2002-353245 | 12/2002 |
| JP | A-2003-086673 | 3/2003 |
| JP | A-2004-335526 | 11/2004 |
| KR | 2001-95222 A | 11/2001 |
| KR | 2003-7438 A | 1/2003 |

OTHER PUBLICATIONS

Quirk, Michael and Julian Serda, Semiconductor Manufacturing Technology, 2001, Prentice Hall, p. 202, 261, 340.*

* cited by examiner

*Primary Examiner*—Asok K Sarkar
(74) *Attorney, Agent, or Firm*—Oliff & Berridge, PLC

(57) ABSTRACT

A method of manufacturing a semiconductor device includes forming a plurality of conductive layers above a substrate; forming a plurality of interlayer insulating layers; forming with dry etching a first hole penetrating the upper interlayer insulating layer to reach the lower insulating layer; forming a protective film on the first hole; and forming by etching a second hole penetrating the lower interlayer insulating layer via the first hole having the protective film formed thereon to form a contact hole.

14 Claims, 15 Drawing Sheets

SEMICONDUCTOR DEVICE AND MANUFACTURING METHOD THEREOF, ELECTRO-OPTICAL DEVICE AND MANUFACTURING METHOD THEREOF, AND ELECTRONIC APPARATUS

BACKGROUND OF THE INVENTION

1. Technical Field

The present invention relates to a semiconductor device having a contact hole in a stacked structure on a substrate, for use in an electro-optical device such as a liquid crystal device, and a manufacturing method thereof, to an electro-optical device having the semiconductor device and a manufacturing method thereof, and to an electronic apparatus such as a liquid crystal projector.

2. Related Art

One example of a method of manufacturing an electro-optical device using a method of manufacturing this type of a semiconductor device is to manufacture an electro-optical device by forming a plurality of pixel units in an image display region on a substrate and forming a drive circuit for driving the plurality of pixel units in a peripheral region located around the image display region. For the electro-optical device, a pixel switching thin film transistor (hereinafter, referred to as TFT) is formed in each pixel unit, while a semiconductor layer of the TFT and a data line connected to the semiconductor layer are insulated from each other by two types of interlayer insulating layers.

In addition, the data line or the TFT is formed in an image display region on the substrate, and a circuit element, such as a TFT, or a wiring line included in a driving circuit is formed in the peripheral region. More specifically, a TFT serving as a circuit element are formed in the peripheral region on the substrate, simultaneously with the TFT of a pixel unit, so that the wiring lines electrically connected to the semiconductor layer of the TFT and the data line are formed at the same time. Therefore, the TFTs and the wiring lines constructed in this way are insulated from each other using two types of interlayer insulating layers. In addition, in order to connect the wiring line to the semiconductor layer of the TFTs, a contact hole is formed in the two types of interlayer insulating layer, as shown in the followings steps.

Here, of the two types of interlayer insulating layer formed on the substrate, including an upper interlayer insulating layer formed at a relatively upper layer side and a lower interlayer insulating layer formed at a relatively lower layer side, first, a first hole is formed through the upper interlayer insulating layer to a surface of the lower interlayer insulating layer. Next, the first hole is made deeper using wet etching, and a second hole is formed, successively following the first hole, through the lower interlayer insulating layer to the surface of the semiconductor layer of TFT, thereby forming a contact hole. In addition, a conductive layer is successively formed on the surface of the upper interlayer insulating layer from the contact hole, as a wiring line. Here, it is appreciated that the diameter of the second hole can be formed smaller than the diameter of the first hole using the wet etching, and thus, the coverage of a conductive layer within the contact hole can be improved.

However, while forming the second hole, an interface between the upper interlayer insulating layer and the lower interlayer insulating layer is exposed within the hole and it is exposed to etchant. If the film quality around the interface between the upper interlayer insulating layer and the lower interlayer insulating layer is unstable, when the wet etching is conducted, the etchant is soaked deep into the exposed interface between the upper interlayer insulating layer and the lower interlayer insulating layer, which may cause a part of a sidewall within the contact hole to become hollowed. When a hollow is formed like this, the coverage of the wiring line in the contact hole is degraded, which causes the problem of disconnection. In addition, when the lower interlayer insulating layer has a higher etching rate in the wet etching than the upper interlayer insulating layer, the shape of the contact hole will be a pot-shaped, i.e., the diameter of the second hole is formed to be larger than the diameter of the first hole, so that the coverage of the wiring line in the contact hole is degraded.

SUMMARY

An advantage of the invention is that it provides a semiconductor device and a manufacturing method thereof, an electro-optical device having the semiconductor device and a manufacturing method thereof, and an electronic apparatus capable of preventing a disconnection defect in a contact hole.

According to a first aspect of the invention, there is provided a method of manufacturing a semiconductor device including: forming a plurality of conductive layers above a substrate; forming a plurality of interlayer insulating layers, respectively, such that among the plurality of conductive layers, a lower conductive layer formed at a relatively lower layer above the substrate and an upper conductive layer formed at a relatively upper layer are insulated from each other; for a lower interlayer insulating layer formed at a relatively lower layer and an upper interlayer insulating layer formed at a relatively upper layer among the plurality of interlayer insulating layers, forming with dry etching a first hole through the upper interlayer insulating layer to the lower interlayer insulating layer, and at least a part of a sidewall located at an interface between the upper interlayer insulating layer and the lower interlayer insulating layer in the first hole; forming a protective film that covers at least the part located on the interface of the sidewall; forming by etching a second hole penetrating the lower interlayer insulating layer via the first hole having the protective film formed thereon to form a contact hole reaching a surface of the lower conductive layer located at a layer lower than the lower interlayer insulating layer; and electrically interconnecting the lower conductive layer and the upper conductive layer via the formed contact hole.

According to the first aspect of the invention, the lower conductive layer constituting at least a part of a circuit element or a wiring line is formed above a substrate, and then, a lower interlayer insulating layer is formed on a lower conductive layer while an upper interlayer insulating layer is formed on the lower interlayer insulating layer. In addition, a first etching process is conducted to the upper interlayer insulating layer and the lower interlayer insulating layer to form a first hole. The bottom of the first hole formed in this way is located in the lower interlayer insulating layer, while a part of the sidewall of the first hole is located at the interface between the upper interlayer insulating layer and the lower interlayer insulating layer. In other words, the first hole is exposed to the interface between the upper interlayer insulating layer and the lower interlayer insulating layer. Here, the first etching process is conducted using dry etching or using both dry etching and wet etching. At this time, for the first hole, a part of the sidewall located at the interface between the upper interlayer insulating layer and the lower interlayer insulating layer is formed using dry etching.

Next, a protective film covering the sidewall of the first hole is formed. After forming the protective film, the protective film may be patterned. The protective film is made of a material having a relatively stable film quality at the initial deposition, upon conducting wet etching during the second etching process, which will be described in detail later. After forming the protective film, a part of the sidewall located at the interface between the upper interlayer insulating layer and the lower interlayer insulating layer for the first hole is covered with the protective film.

Next, a second etching process is conducted to the lower interlayer insulating layer using wet etching or using both dry etching and wet etching to form a second hole penetrating the lower interlayer insulating layer via the first hole having the protective film formed thereon, so that a contact hole is formed up to the surface of the lower conductive layer located lower than the lower interlayer insulating layer. At this time, a part of the sidewall located at the interface between the upper interlayer insulating layer and the lower interlayer insulating layer for the first hole is protected with the protective film. Therefore, upon conducting wet etching, even though a film state around the interface for the upper interlayer insulating layer and the lower interlayer insulating layer is unstable, it can be prevented that etchant is soaked deep into the interface between the upper interlayer insulating layer and the lower interlayer insulating layer to thus form a hollow at the interface.

Next, an upper conductive layer constituting at least a part of a circuit element or a wiring line and located at a layer higher than the upper interlayer insulating layer is successively formed in the contact hole from a surface of the lower conductive layer exposed in the contact hole. Alternatively, an upper conductive layer may be formed such that a conductive film is formed in the contact hole to form a plug and the upper conductive layer is connected to the plug. Therefore, a part of the upper conductive layer or the plug can be formed in the contact hole in a state that a hollow is not made at the portion of the sidewall located at the interface between the upper interlayer insulating layer and the lower interlayer insulating layer.

According to this aspect, the coverage of the conductive film constituting the upper conductive layer or the plug can be improved in the contact hole for electrically connecting the upper conductive layer and the lower conductive layer insulated from each other by two or more interlayer insulating layers among the plurality of conductive layers formed above the substrate. Therefore, for example, when the upper conductive layer is formed as a wiring line, a disconnection defect of the wiring line can be prevented in the contact hole, it is possible to improve a yield.

It is preferable that the forming of the protective film include forming resist serving as the protective film. In addition, the forming of the contact hole includes removing the resist after the forming of the second hole.

In this case, after forming resist serving as a protective film that covers the sidewall of the first hole and patterning the resist, a part of the sidewall located at the interface between the upper interlayer insulating layer and the lower interlayer insulating layer for the first hole is covered with the resist. Therefore, when the second hole is formed, it can be prevented that etchant is soaked deep into a part of the sidewall located at the interface between the upper interlayer insulating layer and the lower interlayer insulating layer for the first hole to thus form a hollow at the interface.

It is further preferable that the protective film be left as at least a part of the sidewall of the contact hole.

In this case, compared to a case in which the protective film is formed with resist, adhesiveness between the sidewall and the bottom of the first hole and the protective film can be improved. Therefore, when the second hole is formed, it will be guaranteed that etchant is prevented from soaking deep from the contact portion between the bottom of the first hole and the protect film into a contact portion between the sidewall of the first hole and the protective film. Therefore, it can be prevented that etchant is soaked deep into a part of the sidewall located at the interface between the upper interlayer insulating layer and the lower interlayer insulating layer for the first hole to thus form a hollow at the interface. In addition, compared to a case where the protective film is made of resist, a process ends even when the protective film are not removed after forming the second hole, so that the number of processing for a method of manufacturing a semiconductor device can be reduced.

It is preferable that forming the first hole is conducted using dry etching or using both dry etching and wet etching.

In this case, the first hole is formed using the first etching process as dry etching. Alternatively, using the first etching process, e.g., by wet etching an initial hole of the first hole to form a hole, the initial hole formed in this way is further progressed using dry etching to thus form the first hole. In this case, by adjusting a processing time according to wet etching, a part of the sidewall located at the interface between the upper interlayer insulating layer and the lower interlayer insulating layer for the first hole is formed using dry etching. Therefore, the part of the sidewall located at the interface between the upper interlayer insulating layer and the lower interlayer insulating layer for the first hole is formed using dry etching, so that the part of the sidewall can be prevented from being hollowed.

It is preferable that the forming of the first hole is conducted by controlling a diameter and a depth of the first hole such that a diameter at an edge of the first hole to a depth of the first hole has an aspect ratio of 1/4 or less.

In this case, using a process of forming the protective film, a thickness of the protective film formed in the first hole can be determined as a value to prevent the etchant for the second etching process from being soaked deep into the part of the sidewall located at the interface between the upper interlayer insulating layer and the lower interlayer insulating layer for the first hole to thus form a hollow.

It is preferable that the forming of the protective film includes forming in the first hole a small hole having a diameter smaller than a diameter at an edge of the first hole from a surface of the protective film to a bottom of the first hole, and forming the contact hole includes forming the second hole such that the second hole penetrates the lower interlayer insulating layer from the surface of the bottom of the first hole exposed to the small hole.

In this case, with respect to the forming of the protective film, the protective film is patterned, so that the small hole is formed from the surface of the protective film to the bottom of the first hole. Next, by performing the second etching process to the lower interlayer insulating layer, the second hole is formed penetrating from the bottom of the first hole exposed in the small hole of the protective film to the lower interlayer insulating layer. Here, for the second etching process, when the etching process based on wet etching is conducted for a long time, it is possible that the etchant is soaked deep from the contact portion between the bottom of the first hole and the protective film to the contact portion between the sidewall of the first hole and the protective film. Compared to the contact portion between the bottom of the first hole and the protective film, the contact portion between the sidewall of the first hole and the protective film has relatively low adhesiveness, so that when the etchant is soaked deep into the contact portion, the part of the sidewall located at the interface between the upper interlayer insulating layer and the lower interlayer insulating layer may be hollowed. Therefore, in consideration with soaking of the etchant described above, it is preferable that a processing time based on wet etching be adjusted. A diameter of the second hole formed in this way is smaller than a diameter of the first hole. Therefore, the coverage of the upper conductive layer, for example, can be improved in the contact hole.

Here, with the arrangement in which forming the protective film includes forming a small hole in the first hole, during the forming of the contact hole, the second hole may be formed such that there is left the bottom of the first hole at least by a position difference between the small hole and the first hole.

In this case, upon conducting wet etching for the second etching process, it can be prevented that the etchant is soaked deep from the contact portion between the bottom of the first hole and the protective film to the contact portion between the sidewall of the first hole and the protective film and that a hollow is formed at the part of the sidewall located at the interface between the upper interlayer insulating layer and the lower interlayer insulating layer for the first hole. Here, upon forming the protective film, for the sidewall of the first hole, a thickness of the protective film from an edge of the first hole to an edge of the small hole is preferably adjusted to be a value such that the bottom of the first hole is left after the second etching process as described above.

It is preferable that during the forming of the contact hole, when the second hole is formed, wet etching may be conducted using a single wafer processing device.

In this case, for the second etching process, in a case in which the sidewall and bottom of the first hole and the protective film have poor adhesiveness, when wet etching is conducted with, for example, a dipping device, there may be a problem in that etchant is soaked deep and thus a hollow is formed on a part of the sidewall located at the interface between the upper interlayer insulating layer and the lower interlayer insulating layer for the first hole. In this case, by performing wet etching with a sing wafer processing device, it can be prevented that the hollow is formed on the part of the sidewall located at the interface between the upper interlayer insulating layer and the lower interlayer insulating layer for the first hole. Here, the 'single wafer processing' device refers to a device that performs the second etching process to the substrate where a plurality of conductive layers and a plurality of interlayer insulating layers are formed to provide the first hole in the upper interlayer insulating layer and the lower interlayer insulating layer and the a protective film is formed in the first hole, by, for example, depositing etchant with spin coating, one by one. Further, the 'dipping' device refers to a device that performs the second etching process to the substrates in the above-mentioned state by dipping into the etchant in a lump sum.

It is preferable that during the forming of the contact hole, when the second hole is formed, wet etching and dry etching may be used as an etching method.

In this case, with respect to the second etching process, for example, by forming an initial hole of the second hole using dry etching and further progressing the initial hole based on wet etching, the second hole is formed. In this case, it can be prevented that the etchant for the second etching process is soaked deep and thus a hollow is formed on the part of the sidewall located at the interface between the upper interlayer insulating layer and the lower interlayer insulating layer for the first hole.

It is preferable that during the forming of the plurality of interlayer insulating layers, respectively, the lower interlayer insulating layer may be made of a material having a relatively large etch rate for wet etching used when forming the second hole with a process of forming the contact hole, compared to the upper interlayer insulating layer.

In this case, with respect to the second etching process, when an etching rate for wet etching of the lower interlayer insulating layer is higher than that of the upper interlayer insulating layer, a hole can be formed such that a diameter of the second hole is smaller than a diameter of the first hole. In addition, it can be prevented that the etchant for the second etching process is soaked deep and a hollow is formed on the part of the sidewall located at the interface between the upper interlayer insulating layer and the lower interlayer insulating layer for the first hole, so that the coverage of the upper conductive layer can be improved in the contact hole.

It is preferable that the forming of the plurality of conductive layers includes forming a semiconductor layer of a thin film transistor serving as the lower conductive layer; forming a gate insulating film of the thin film transistor on the semiconductor layer, and then, forming a gate electrode of the thin film transistor on the gate insulating film; and forming a wiring line electrically connected to the semiconductor layer for serving as the upper conductive layer.

In this case, with respect to a thin film transistor and a wiring line formed above a substrate, the wiring line serving as the upper conductive layer is successively formed in the contact hole, for example, from the surface of the thin film transistor serving as the lower conductive layer. Therefore, the disconnection defect in the contact hole of the wiring line can be prevented.

According to a second aspect of the invention, there is provided a semiconductor device manufactured by the method of manufacturing a semiconductor device of the invention (including various aspects).

According to the second aspect of the invention, for example, when the upper conductive layer is formed as a wiring line, the disconnection defect in the contact hole of the wiring line can be prevented.

According to a third aspect of the invention, there is provided a method of manufacturing an electro-optical device that manufactures the electro-optical device using aspects including forming a semiconductor layer of a thin film transistor serving as the lower conductive layer and forming a wiring line electrically connected to the semiconductor layer serving as an upper conductive layer in the method of manufacturing the semiconductor device of the invention, including: forming a plurality pixel units in an image display region above the substrate; and forming a driving circuit for driving the plurality of pixel units, by forming the thin film transistor and the wiring line in a peripheral region located around the image display region.

According to the third aspect of the invention, the driving circuit for driving the plurality of pixel units includes a thin film transistor serving as a circuit element, or a wiring line connected to the thin film transistor. In addition, the disconnection defect of the wiring line connected to the thin film transistor formed in the driving circuit can be prevented, so that the yield can be improved for a manufacturing process of the electro-optical device.

According to a fourth aspect of the invention, there is provided an electro-optical device manufactured by the method of manufacturing the electro-optical device described above.

According to the fourth aspect of the invention, since the electro-optical device is manufactured by the method of manufacturing an electro-optical device of the invention described above, the disconnection defect of the wiring lines for the drive circuit can be prevented, which used to be a problem around the peripheral region above the substrate, thereby achieving an electro-optical device having high reliability.

According to a fifth aspect of the invention, there is provided an electronic apparatus having the above-mentioned electro-optical device.

Since the electronic apparatus includes the electro-optical device described above, it is also possible to implement various electronic apparatuses having a high reliability, such as a projective display device, a television, a cellular phone, an electronic note, a word processor, a view-finder-type or monitor-direct-view-type video tape recorder, a workstation, a video phone, a POS terminal, and a touch panel. In addition, it is possible to implement an electrophoresis device, such as an electronic paper, an electronic emission device (field emission display and conduction electron-emitter display), as an electronic apparatus of the invention, and a digital light processing (DLP) as a device using the electrophoresis device and the electron emission device.

BRIEF DESCRIPTION OF THE DRAWINGS

The invention will be described with reference to the accompanying drawings, wherein like numbers reference like elements, and wherein.

DESCRIPTION OF THE EMBODIMENTS

Advantages and benefits of the invention will be apparent from embodiments, which will be described in detail below.

Exemplary embodiments of the invention will now be described with reference to the accompanying drawings. The following description is directed to an electro-optical device for use in a liquid crystal display device.

1: First Embodiment

First, an electro-optical device according to a first embodiment of the invention will be described with reference to FIGS. 1 to 13.

1-1: Overall Structure of Electro-optical Device

Figure 1:
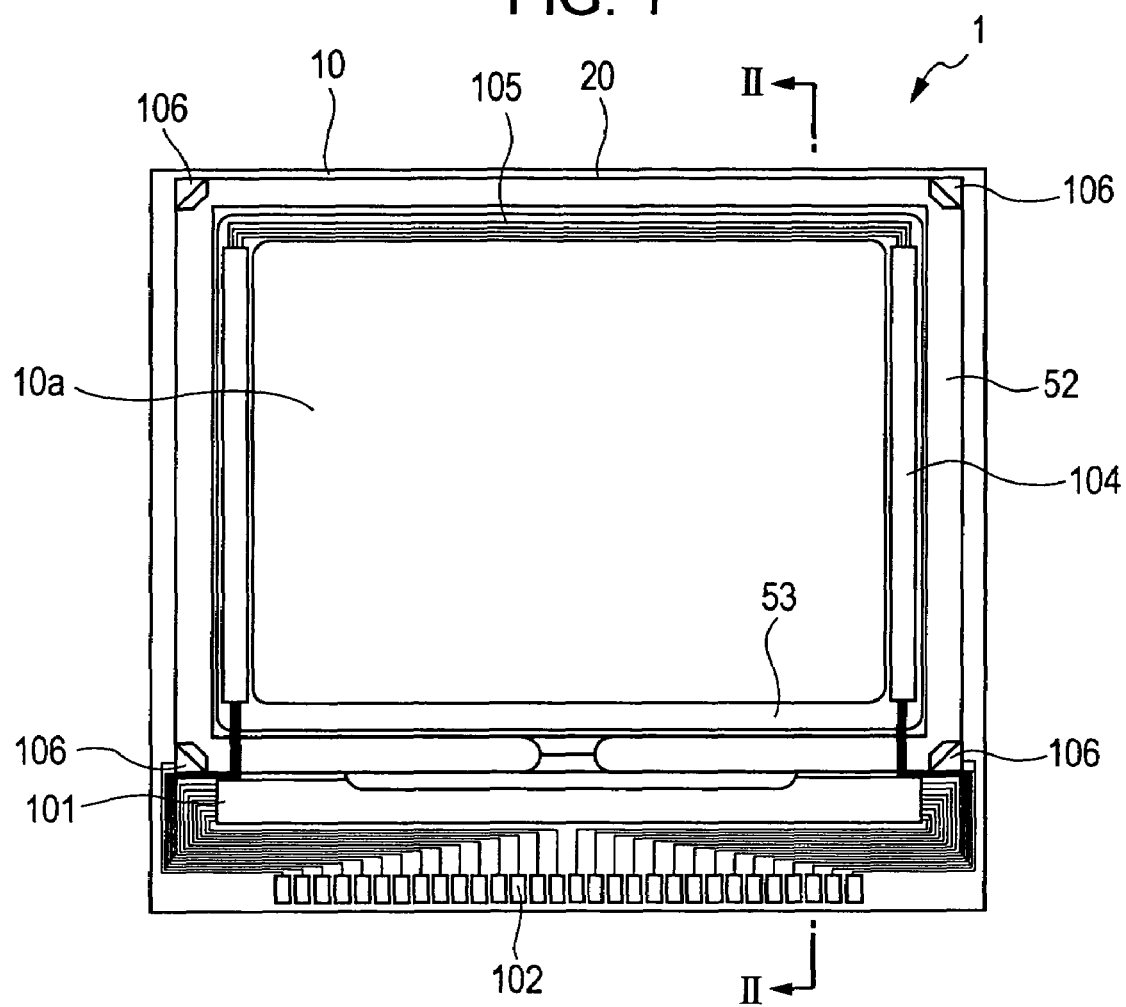
FIG. 1 is a plan view showing the overall structure of an electro-optical device according to a first embodiment of the invention.
Figure 2:
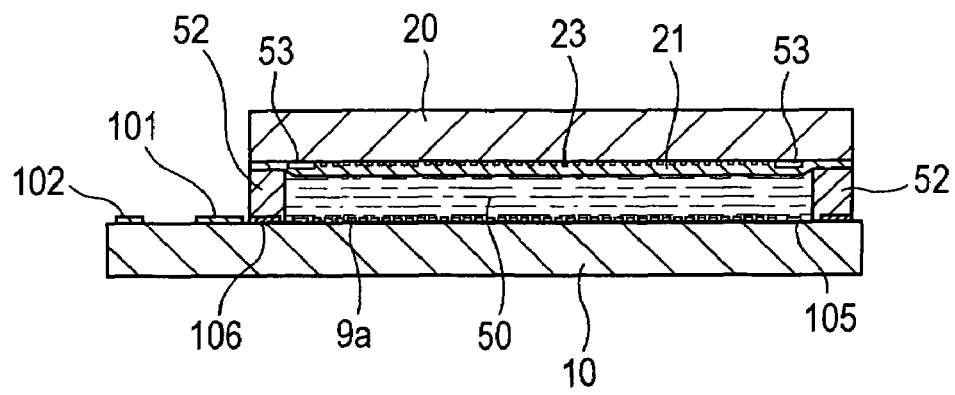
FIG. 2 is a cross-sectional view taken along the line II-II of FIG. 1.

First, the overall structure of the electro-optical device according to the first embodiment of the invention will be described with reference to FIGS. 1 and 2. Here, FIG. 1 is plan view of the electro-optical device in a case in which a TFT array substrate and respective constituent elements formed thereon are seen from a side of a counter substrate, and FIG. 2 is a cross-sectional view taken along the line II-II of FIG. 1. Here, one example of an electro-optical device, i.e., an integrated-drive-circuit TFT-active-matrix-driven liquid crystal device will be illustrated.

As shown in FIGS. 1 and 2, in the electro-optical device according to the present embodiment, a counter substrate 20 is arranged to face a TFT array substrate 10. A liquid crystal layer 50 is sealed between the TFT array substrate 10 and the counter substrate 20, and the TFT array substrate 10 and the counter substrate 20 are bonded with each other by a sealant 52 arranged on a sealing region located around an image display region 10a.

The sealant 52, which is made of, for example, an ultraviolet curable resin and a thermosetting resin for bonding both substrates with each other, is deposited on the TFT array substrate 10 during a manufacturing process and then cured by ultraviolet irradiation and heating. In addition, in the sealant 52, spacer materials, such as glass fibers or glass beads, are scattered to make a predetermined gap between the TFT array substrate 10 and the counter substrate 20 (inter-substrate gap). In other words, the electro-optical device of the present embodiment is used for a compact light valve of a projector, which is suitable for performing enlargement display.

Along with an inner side of the sealing region where the sealant 52 is arranged, a light-shielding-typed frame-shaped light shielding film 53 that defines a frame region of the image display region 10a is arranged at the side of the counter substrate 20. However, a part or all of the frame-shaped light shielding film 53 may be arranged at the side of the TFT array substrate 10 as an integrated light shielding film. Moreover, according to the present embodiment, there is a peripheral region located around the image display region 10a described above. That is, according to the present embodiment, in particular, the peripheral region is defined as a region farther than the frame-shaped light shielding film 53 from a center of the TFT array substrate 10.

In the peripheral region, in a region located at the outside of the sealing region where the sealant 52 is arranged, a data line driving circuit 101 and an external-circuit connection circuit 102 are arranged along one side of the TFT array substrate 10. In addition, scanning line driving circuits 104 are arranged along two sides, adjacent to the one side, to cover the frame-shaped light shielding film 53. Further, in order to connect the two scanning line driving circuits 104 arranged at both sides of the image display region 10a as described above, a plurality of wiring lines 105 are arranged along one remaining side of the TFT array substrate 10 to cover the frame-shaped light shielding film 53.

In addition, upper and lower conductive members 106 that serve as upper and lower conductive terminals between two substrates are arranged at four corners of the counter substrate 20. Further, upper and lower conductive terminals are arranged on the TFT array substrate 10, in regions corresponding to these corners. Thereby, the TFT array substrate 10 and the counter substrate 20 can be electrically connected to each other.

In FIG. 2, on the TFT array substrate 10, an alignment film is formed on a pixel electrode 9a after forming the pixel switching TFT or the wiring lines, such as the scanning lines and the data lines. Further, on the counter substrate 20, a lattice-shaped or stripe-shaped light shielding film 23 in addition to the counter electrode 21 is formed on the counter substrate 20, and also, an alignment film is formed on an uppermost portion. In addition, the liquid crystal layer 50 is made of liquid crystal containing a mixture of, for example, one or more kinds of nematic liquid crystal, in a predetermined alignment state between a pair of alignment films.

In addition, on the TFT array substrate 10 shown in FIGS. 1 and 2, there may be formed a sampling circuit that samples and supplies image signals on image signal lines to the data lines, a precharge circuit that supplies a precharge signal at a predetermined voltage level to the plurality of data lines preceding the image signals, and a test circuit that tests, for example, the quality and level of defects of the electro-optical device during manufacturing or shipping, in addition to the data line driving circuit 101 and the scanning line driving circuits 104.

1-2: Structure of Pixel Unit

The structure of the pixel unit in the electro-optical device according to the embodiment of the invention will now be described with reference to FIGS. 3 to 6.

Figure 3:
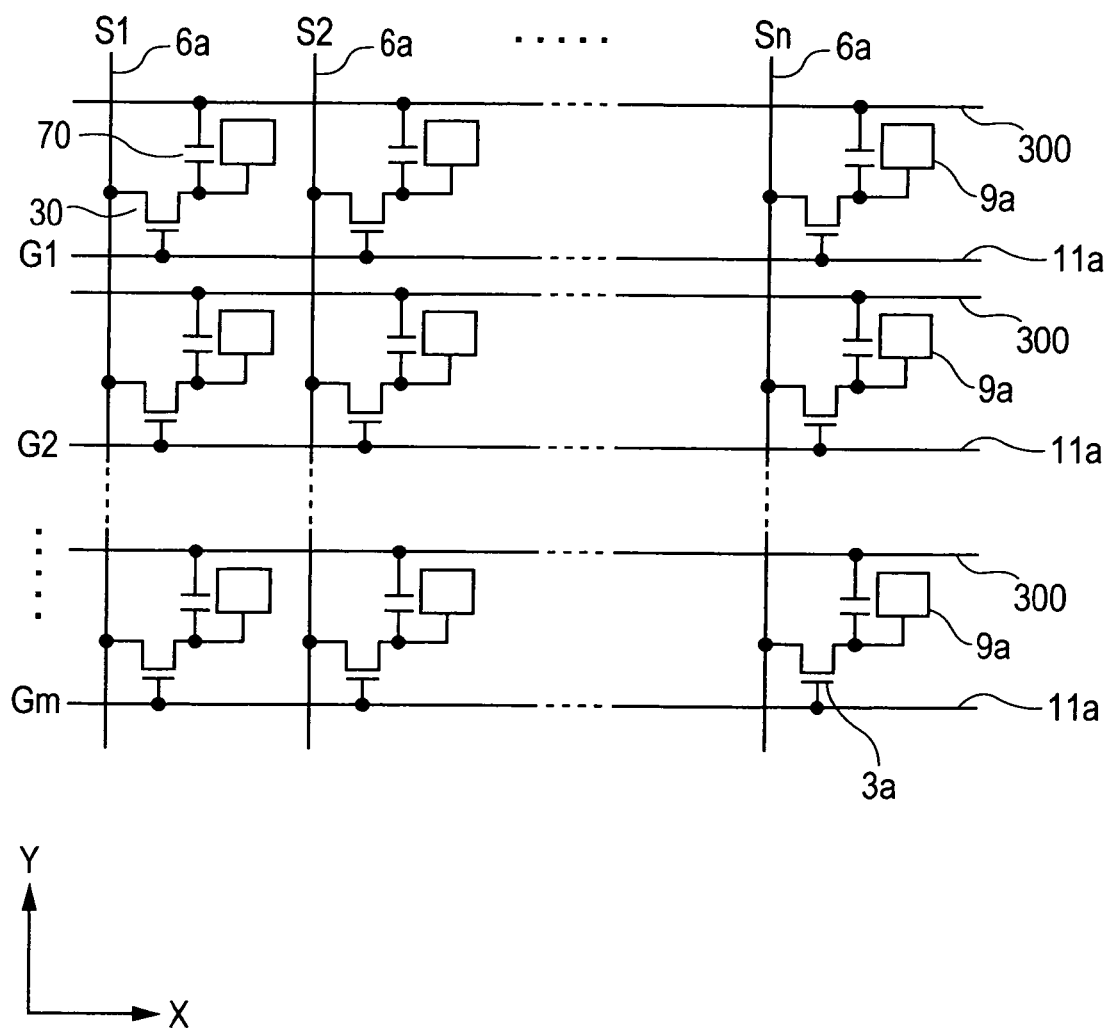
FIG. 3 is an equivalent circuit diagram of various elements and wiring lines in a plurality of pixel units that are formed in a matrix and constitute an image display region of the electro-optical device.
Figure 4:
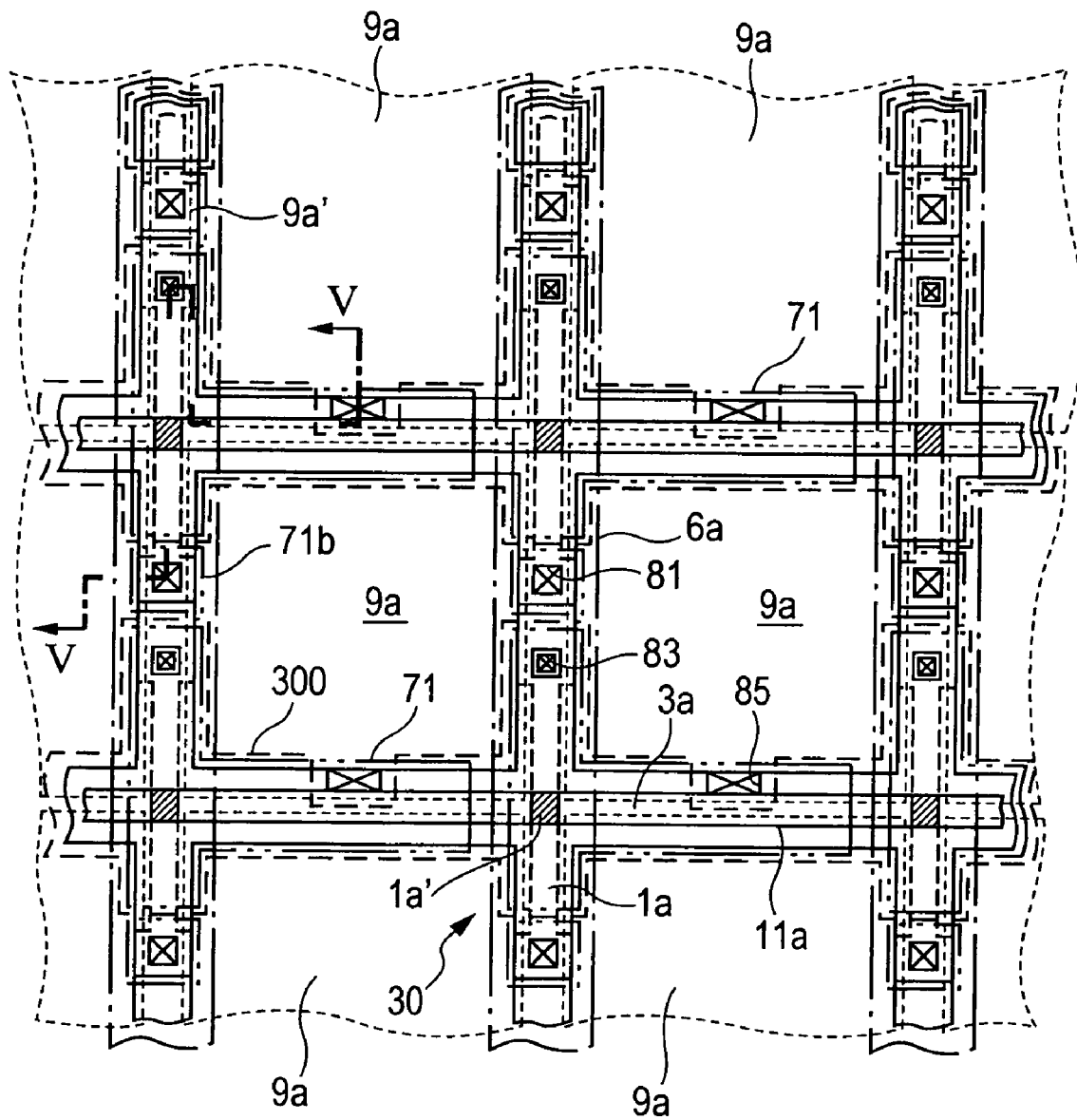
FIG. 4 is a plan view of a plurality of pixel groups adjacent on a TFT array substrate having data lines, scanning lines and pixel electrodes formed thereon.
Figure 5:
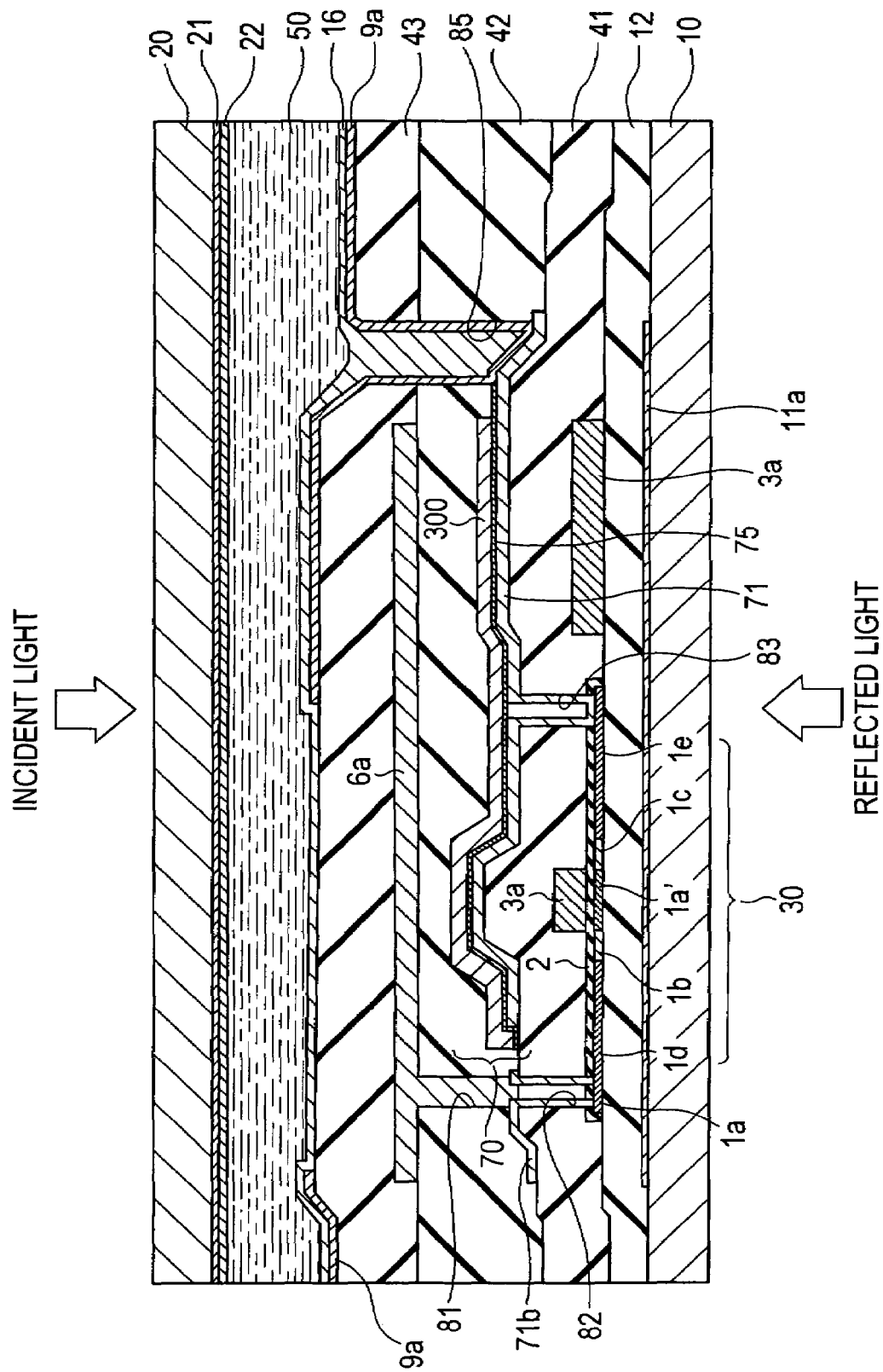
FIG. 5 is a cross-sectional view taken along the line V-V of FIG. 4.

Here, FIG. 3 is an equivalent circuit diagram of various elements, wiring lines, or the like for a plurality of pixel units that are formed in a matrix and constitute an image display region of the electro-optical device of the present embodiment; FIG. 4 is a plan view of a plurality of adjacent pixel groups on a TFT array substrate having data lines, scanning lines, and pixel electrodes formed thereon; and FIG. 5 is a cross-sectional view taken along the line V-V of FIG. 4. In FIG. 5, the scale of each layer or member is adjusted in order to have a recognizable size in the drawings.

In FIG. 3, in each of the plurality of pixels formed in a matrix for constituting the image display region of the electro-optical device according to the present embodiment, the pixel electrode 9a and the TFT 30 for controlling the switching of the pixel electrode 9a are provided, and the data lines 6a to which the image signals are supplied are electrically connected to a source electrode of the corresponding TFT 30. Image signals S1, S2, . . . , and Sn written into the data line 6a may be line-sequentially supplied in this order, or alternatively, may be supplied for each group consisting of the plurality of data lines 6a adjacent to each other.

In addition, with the scanning line 3a electrically connected to a gate electrode of the TFT 30, scanning signals G1, G2, . . . , and Gm are line-sequentially applied to the scanning line 3a in a pulse manner in this order at a predetermined timing. The pixel electrode 9a is electrically connected to a drain electrode of the TFT 30, and image signals S1, S2, . . . , and Sn supplied from the data line 6a are written at a predetermined timing with the TFT 30 serving as a switching element switched-on for a certain period.

Predetermined levels of image signals S1, S2, and Sn written to the liquid crystal, which is one example of an electro-optical material, via the pixel electrode 9a, are held between the counter electrode formed on the counter substrate and the pixel electrode for a certain period. The liquid crystal changes its alignment and ordering of molecular groups based on the applied voltage level, to modulate light and enable gray-scale level display. For a normally-white mode, the transmittance with respect to incident light is reduced in response to a voltage applied to each pixel unit, while for a normally-black mode, the transmittance with respect to the incident light is increased in response to a voltage applied to each pixel unit, so that light having a contrast in response to an image signal from the electro-optical device is emitted as a whole.

Here, in order to prevent the held image signal from leaking, a storage capacitor 70 is additionally provided in parallel with a liquid crystal capacitance formed between the pixel electrode 9a and the counter electrode.

Next, the overall structure of the pixel unit will now be described with reference to FIGS. 4 and 5. Referring to FIG. 4, a plurality of transparent pixel electrodes 9a (whose contour is indicated by a dotted line 9a') are arranged in a matrix on the TFT array substrate of the electro-optical device, and the data lines 6a and the scanning lines 3a are arranged along column and row borders of the pixel electrode 9a.

In addition, the scanning line 3a is arranged to face a channel region 1a' of the semiconductor layer 1a, indicated in a shaded region of a upper-right part of FIG. 4, so that the scanning line 3a includes a gate electrode. Likewise, the pixel switching TFT 30 on which a part of the scanning line 3a faces the channel regions 1a' as a gate electrode is arranged at a place where the scanning line 3a and the data line 6a intersect.

Figure 6:
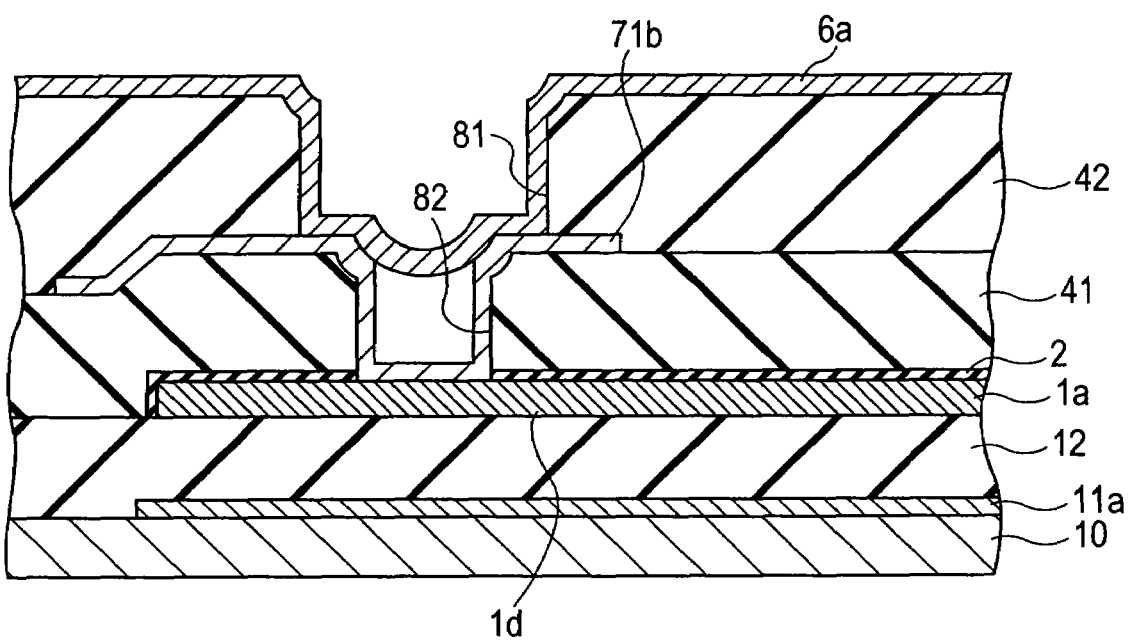
FIG. 6 is a detailed cross-sectional view showing the structure of a connection portion between the data lines and a semiconductor layer of a TFT.

Here, FIG. 6 is a detailed cross-sectional view showing the structure of a connection portion between the data line 6a and the semiconductor layer 1a of the TFT 30, shown in FIG. 5. As shown in FIGS. 5 and 6, the data line 6a is formed using a second interlayer insulating layer 42 whose top surface is smooth as a base, so that a part of the data line 6a formed in the contact hole 81 penetrating into the second interlayer insulating layer 42 is connected from a contact hole 82 penetrating a first interlayer insulating layer 41 through a relay layer 71b successively formed on the surface of the first interlayer insulating layer 41 to a heavily doped source region 1d of the TFT 30. In the present embodiment, the data line 6a is made of, for example, a material containing Al (aluminum) or elemental Al. In addition, the relay layer 71b is preferably made of a conductive polysilicon film.

Further, in FIG. 5, the storage capacitor 70 is formed such that a lower capacitor electrode 71 serving as a pixel-potential-side capacitor electrode connected to a heavily doped drain region 1e of the TFT 30 and the pixel electrode 9a faces a part of an upper capacitor electrode 300 serving as a fixed-potential-side capacitor electrode through a dielectric film 75.

As shown in FIGS. 4 and 5, the upper capacitor electrode 300 is made of, for example, a conductive light shielding film containing metal or alloy, and arranged at the upper side of the TFT 30 as an example of the upper-side light shielding film (integrated light shielding film). In addition, the upper capacitor electrode 300 also serves as a fixed-potential-side capacitor electrode. The upper capacitor electrode 300 is made of, for example, an elemental metal, consisting of at least one of high melting point metals, such as Ti (titanium), Cr (chromium), W (tungsten), Ta (tantalum), Mo (molybdenum), and Pd (palladium), and alloy, metal silicide, polysilicide, and a stacked combination thereof. Alternatively, the upper capacitor electrode 300 may be made of another metal, such as Al (aluminum), Ag (silver), or the like. However, the upper capacitor electrode 300 may have a multi-layered structure in which a first film made of, for example, a conductive polysilicon film, and a second film made of a metal polysilicide film containing a high melting point metal are stacked on one another.

Further, the lower capacitor electrode 71 is made of, for example, a conductive polysilicon film, serving as a pixel-potential-side capacitor electrode. The lower capacitor electrode 71 serves as a light absorption layer or another example of an upper-side light shielding film arranged between the TFT 30 and the upper capacitor electrode 300 serving as an upper-side light shielding film, in addition to serving as a pixel-potential-side capacitor electrode, and further, serves to relay and connect the pixel electrode 9a and the heavily doped drain region 1e of the TFT 30. However, like the upper capacitor electrode 300, the lower capacitor electrode 71 may be made of a single-layered film or a multi-layered film containing metal or alloy.

A dielectric film 75 arranged between the lower capacitor electrode 71 and the upper capacitor electrode 300 serving as a capacitor electrode is made of, for example, a silicon oxide film, such as an HTO (high temperature oxide) film and an LTO (low temperature oxide) film, or a silicon nitride film. With respect to increasing the storage capacitor 70, the thinner dielectric film 75 is preferably provided such that film reliability can be fully obtained.

In addition, the upper capacitor electrode 300 is arranged to extend from the image display region, where the pixel electrode 9a is arranged, to the peripheral region, and is electrically connected to a constant potential source, serve as a fixed potential. The related constant potential source may be a positive-potential power supply or a negative-potential power supply supplied to the scanning line driving circuit 104 or the data line driving circuit 101, any may also be a constant potential supplied to the counter electrode 21 of the counter substrate 20.

In addition, the lower light shielding film 11a is arranged in a matrix via the base insulating film 12 below the TFT 30.

The lower light shielding film 11a is arranged to shield light at and around the channel region 1a' of the TFT 30 from reflected light incident on the device from the TFT array substrate 10 side. The lower light shielding film 11a is made of, for example, an elemental metal consisting of at least one among high melting-point metals such as Ti, Cr, W, Ta, Mo, and Pd, alloy, metal silicide, polysilicide, and a stacked combination thereof, similarly to the upper capacitor electrode 300 constituting an example of the upper light shielding film.

Further, the lower light shielding film 11a may also be arranged to extend from the image display region to the peripheral region and connected to a constant potential source, similarly to the upper capacitor electrode 300, to avoid deleterious effects of the potential variance on the TFT 30.

The base insulating film 12 is formed on the entire surface of the TFT array substrate 10, serving to prevent degradation of the characteristics of the pixel switching TFT 30 caused by roughness in polishing the surface of the TFT array substrate 10 and dirt left after cleaning, in addition to causing the TFT 30 to be insulated between the layers from the lower light shielding film 11a.

The pixel electrode 9a connects the lower capacitor electrode 71, to be electrically connected to the heavily-doped drain region 1e of the semiconductor layer 1a via the contact holes 83 and 85. In the present embodiment, when using the lower capacitor electrode 71 having various functions as described above, even though an interlayer distance is, for example, as large as 2000 nm, connection between these layers can be readily made at the contact hole and a groove while avoiding the technical difficulty of connecting two layers through one contact hole, thus improving the pixel aperture ratio and preventing etch penetration when forming a contact hole.

As shown in FIGS. 4 and 5, the electro-optical device includes a transparent TFT array substrate 10 and a transparent counter substrate 20 facing the transparent TFT array substrate 10. The TFT array substrate 10 is made of, for example, a quartz substrate, a glass substrate, and a silicon substrate, and the counter substrate 20 is made of, for example, a glass substrate and a quartz substrate.

The TFT array substrate 10 has the pixel electrodes 9a arranged thereon, and an alignment film 16 to which a predetermined alignment processing, such as a rubbing processing is performed is arranged on the pixel electrode 9a. The pixel electrode 9a is made of, for example, a transparent conductive film, such as an indium tin oxide (ITO) film. In addition, the alignment film 16 is made of, for example, an organic film, such as a polyimide film.

Further, the counter electrode 21 is arranged over the entire surface of the counter substrate 20, and an alignment film 22 subjected to a predetermined alignment processing, such as a rubbing processing, is arranged below the counter electrode 21. The counter electrode 21 is made of, for example, a transparent conductive film, such as an ITO film. In addition, the alignment film 22 is made of an organic film, such as a polyimide film.

The counter substrate 20 may have a light shielding film formed in a lattice or stripe type. With the arrangement described above, incident light from the TFT array substrate 10 side infiltrating into the channel region 1a' and the peripheral region can be reliably prevented, in conjunction with the upper light shielding film arranged as an upper capacitor electrode 300. In addition, the light shielding film on the counter substrate 20 is formed such that the reflectance is increased at the surface where at least external light is irradiated, which serves to prevent a temperature increase of the electro-optical device.

With the arrangement described above, a liquid crystal layer 50 is formed between the TFT array substrate 10 and the counter substrate 20 arranged such that the pixel electrode 9a and the counter electrode 21 face each other. The liquid crystal layer 50 assumes a predetermined alignment state using alignment films 16 and 22 when an electric field is not applied from the pixel electrode 9a.

Referring to FIG. 5, the pixel switching TFT 30 has an LDD (lightly doped drain) structure, including scanning lines 3a, a channel region 1a' of the semiconductor layer 1a where a channel is formed by an electric field from the scanning line 3a, an insulating film 2 including a gate insulating film that insulates the scanning lines 3a and the semiconductor layer 1a, a lightly doped source region 1b and a lightly doped drain region 1c of the semiconductor layer 1a, and a heavily doped source region id and a heavily doped drain region 1e of the semiconductor layer 1a.

A first interlayer insulating layer 41 where the contact hole 82 is provided to pass through the heavily doped source region 1d and the contact hole 83 is provided to pass through the heavily doped drain region 1e is formed on the scanning lines 3a.

The lower capacitor electrode 71 and the upper capacitor electrode 300 are formed on the first interlayer insulating layer 41, and the second interlayer insulating layer 42 where the contact holes 81 and 85 are formed is formed on the lower and upper capacitor electrodes 71 and 300.

The data lines 6a are formed on the second interlayer insulating layer 42, and the third interlayer insulating layer 43 where the contact hole 85 is formed through the lower capacitor electrode 71 is formed thereon. The pixel electrode 9a is arranged on the top surface of the third interlayer insulating layer 43 as described above.

Further, as shown in FIGS. 4 and 5, a step difference formed by various members provided under the second interlayer insulating layer 42, such as the storage capacitor 70, the scanning line 3a, and the TFT 30, is relieved through a planarization process of the surface of the second interlayer insulating layer 42. For example, the planarization is performed by using a polishing process such as a CMP (chemical mechanical polishing) process or using an organic SOG (spin on glass). However, instead of or in addition to the planarization process of the second interlayer insulating layer 42 as described above, the planarization process may be performed such that a groove is formed in at least one of the TFT array substrate 10, the base insulating film 12, and the first interlayer insulating layer 41 to bury the storage capacitor 70, the scanning line 3a, and the TFT 30.

1-3: Arrangement on Peripheral Region

Figure 7:
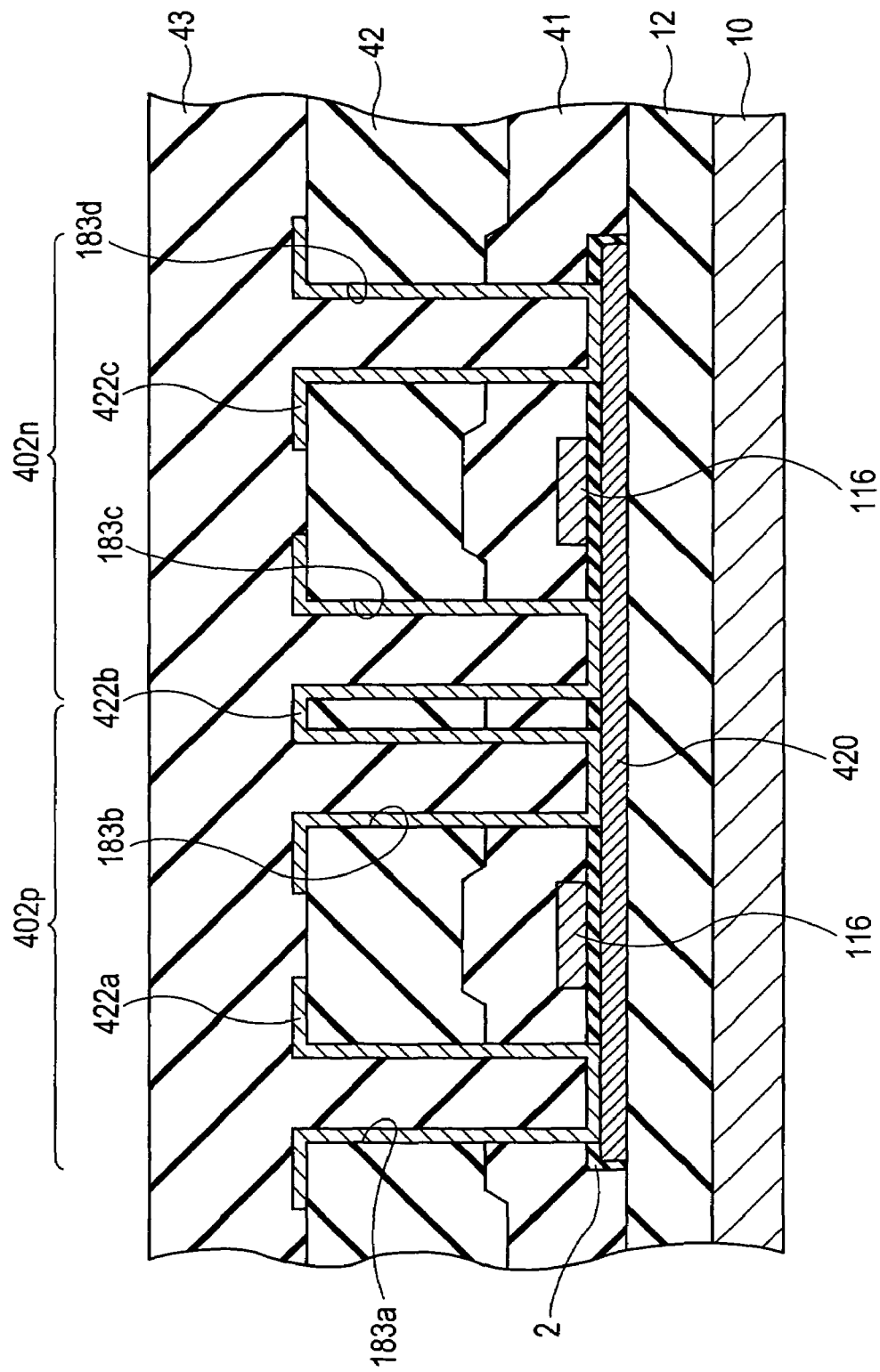
FIG. 7 is a cross-sectional view showing the substantial structure of a CMOS-type TFT that is an example of a switching element formed on a peripheral region.

The structure of the pixel unit as described above is common to each pixel unit, as shown in FIG. 4. In the image pixel region 10a described with reference to FIGS. 1 and 2, the arrangement for such a pixel unit is periodically formed. Further, in the electro-optical device, a driving circuit, such as the scanning line driving circuit 104 or the data line driving circuit 101, is formed on the peripheral region located around the image display region 10a, as described with reference to FIGS. 1 and 2. In addition, the scanning line driving circuits 104 and the data line driving circuits 101 include, for example, wiring lines and TFTs serving as a plurality of switching elements, as shown in FIG. 7. Here, FIG. 7 is a cross-sectional view showing the actual structure of a CMOS-type TFT, which is one example of the switching element formed on the peripheral region.

Referring to FIG. 7, the CMOS-type TFT includes a p-channel-type TFT 402p and an n-channel-type TFT 402n each having a semiconductor layer 420, an insulating film 2 including a gate insulating film, a gate electrode film 116, and various wiring lines 422a to 422c connected to a drain electrode and a source electrode of the semiconductor layer 420. Further, in FIG. 7, as indicated by reference numerals 12, 41, 42 and 43, the CMOS-type TFT and a structure thereon are formed with the same process as that of the pixel unit shown in FIG. 5. In other words, the semiconductor layer 420 is formed through the same process as that of the semiconductor layer 1a of the TFT 30, and the gate electrode film 116 is formed through the same process as that of the scanning lines 3a. Further, the wiring lines 422a to 422c shown in FIG. 7 are formed through the same process as that of the data lines 6a shown in FIG. 5. In addition, though not shown in FIG. 7, a thin film is formed through the same process as that of the lower capacitor electrode 71 and the upper capacitor electrode 300 in FIG. 5, and it is needless to say that this also serves as a part of the CMOS TFT arrangement (for example, for use in wiring lines).

Likewise, with the arrangement in the pixel unit and the arrangement where various circuit elements, such as the CMOS-type TFTs, and wiring lines are formed in the peripheral region through the same process, the manufacturing process can be simplified, or omitted, compared to a case in which these are formed separately.

In addition, according to the present embodiment, the semiconductor layers 420 of the CMOS-type TFTs serving as these circuit elements and the wiring lines 422a to 422c are insulated from each other by the first and second interlayer insulating layers 41 and 42, as in the semiconductor layer 1a of the TFT 30 for the pixel unit and the data line 6a. With the arrangement described above, the 'upper interlayer insulating layer' according to the invention corresponds to the second interlayer insulating layer 42, the 'lower interlayer insulating layer' according to the invention corresponds to the first interlayer insulating layer 41, the 'upper conductive layers' according to the invention correspond to the wiring lines 422a to 422c, and the 'lower conductive layer' according to the invention corresponds to the semiconductor layer 420. In addition, the contact holes 183a to 183d are formed from the surface of the second interlayer insulating layer 42 through the first and second interlayer insulating layers 41 and 42, reaching the surface of the semiconductor layer 420.

Figure 8:
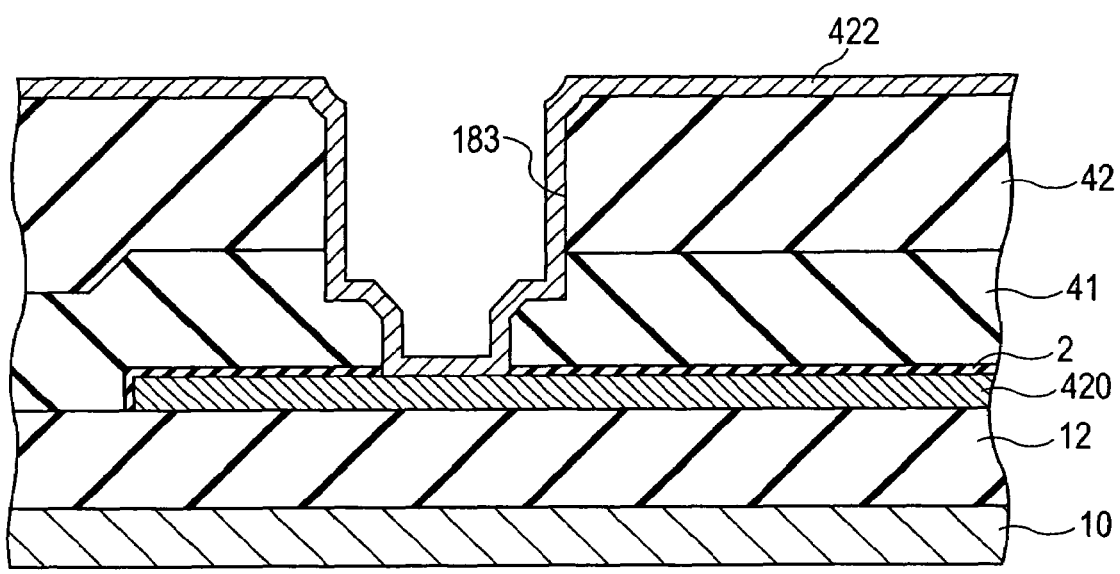
FIG. 8 is a detailed cross-sectional view showing the structure of a connection portion between the wiring lines formed on the peripheral region and a semiconductor layer.

Here, FIG. 8 is a detailed cross-sectional view showing the structure of a connection portion between the wiring lines 422a to 422c and the semiconductor layer 420. In FIG. 8, the wiring line 422 indicates any one of the wiring lines 422a to 422c, and the contact hole 183 indicates any one of the contact holes 183a to 183d. As shown in FIG. 8, a part of the wiring line 422 is successively formed from the surface of the semiconductor layer 420 into the contact hole 183. According to the present embodiment, the contact hole 183 is formed according to a specific manufacturing method described below, so that a disconnection defect of the wiring line 422 in the contact hole 183 can be prevented. Therefore, since it is possible to prevent the disconnection defect for the scanning line driving circuit 104 and the data line driving circuit 101, an electro-optical device having high device reliability can be implemented in the present embodiment.

1-4: Manufacturing Method of Electro-Optical Device

Hereinafter, a manufacturing process of an electro-optical device according to the above-mentioned embodiment will be described with reference to FIGS. 9 to 13. FIG. 9 is a flow diagram sequentially showing the structure of a cross section shown in FIG. 6 for respective steps of the manufacturing process, and FIGS. 10 to 13 are a flow diagram sequentially showing the structure of a cross section shown in FIG. 8 for respective steps of the manufacturing process. Further, forming a connection portion between the data line 6a of the pixel unit and the semiconductor layer 1a of the TFT 30, and forming a connection portion between the wiring line 422 in the peripheral region and the semiconductor layer 420 are described particularly in detail, which are characterized in the present embodiment, and a process of manufacturing other elements, such as the scanning lines 3*a*, the semiconductor layer 1*a*, the gate electrode 3*a*, the storage capacitor 70 and the data line 6*a* will be omitted.

First, with respect to the pixel unit, a manufacturing process of the contact holes 81 and 82 for electrically connecting the data line 6*a* and the TFT semiconductor layer 1*a* will be described with reference to FIG. 9.

Figure 9A:
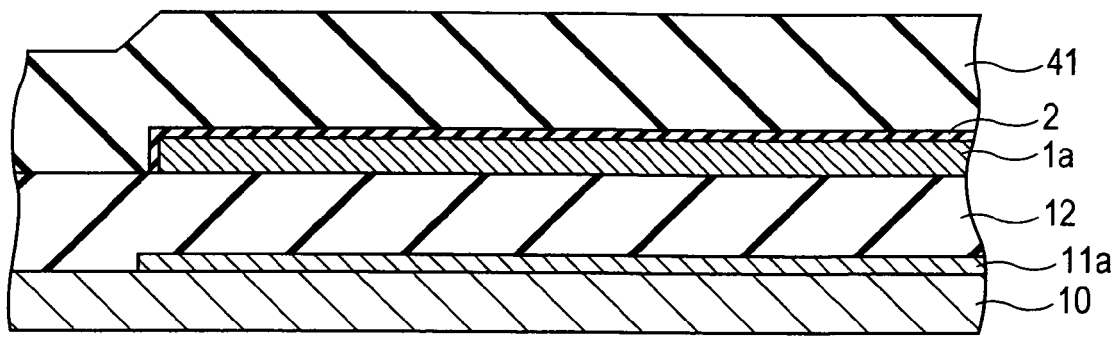
FIG. 9 is a flow diagram sequentially showing the structure of a cross section shown in FIG. 6 for respective steps of a manufacturing process according to the first embodiment of the invention.

Referring to FIG. 9A, the lower light shielding film 11*a*, the base insulating film 12, the TFT 30 are arranged on the TFT array substrate 10. Further, the first interlayer insulating layer 41 is formed on the TFT 30 with a silicate glass film, such as NSG (non-silicate glass) or BPSG (boron phosphorous silicate glass), using a TEOS gas through, for example, a normal pressure or low pressure CVD (chemical vapor deposition) method.

Figure 9B:
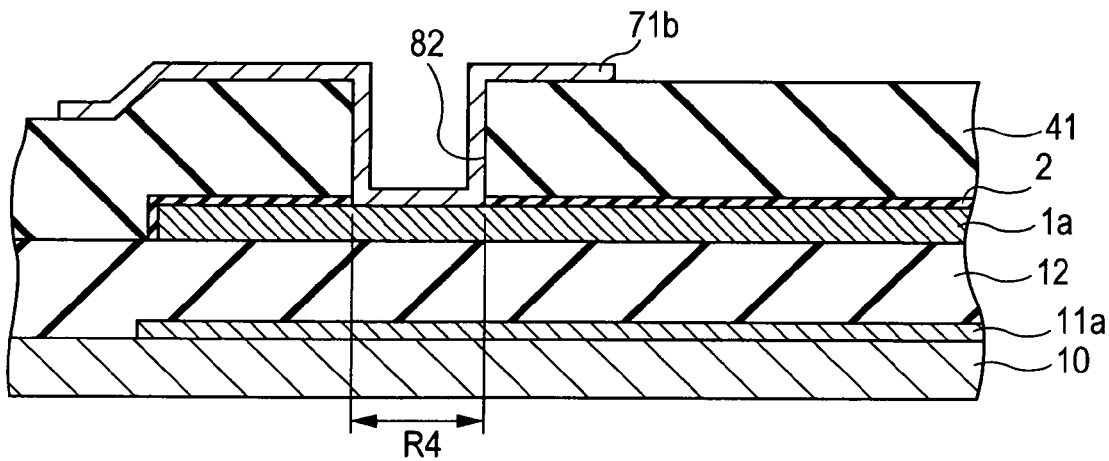

Next, referring to FIG. 9B, the contact hole 82 penetrating the first interlayer insulating layer 41 is formed using, for example, a dry etching method, and a polysilicon film, for example, is successively formed on the surface of the first interlayer insulating layer 41 from the contact hole 82 and is subjected to a conducting treatment, and then, patterned by, for example, photolithography and etching to form the relay layer 71*b*. Further, a diameter R4 of the contact hole 82 is, for example, about 1.5 μm.

Figure 9C:
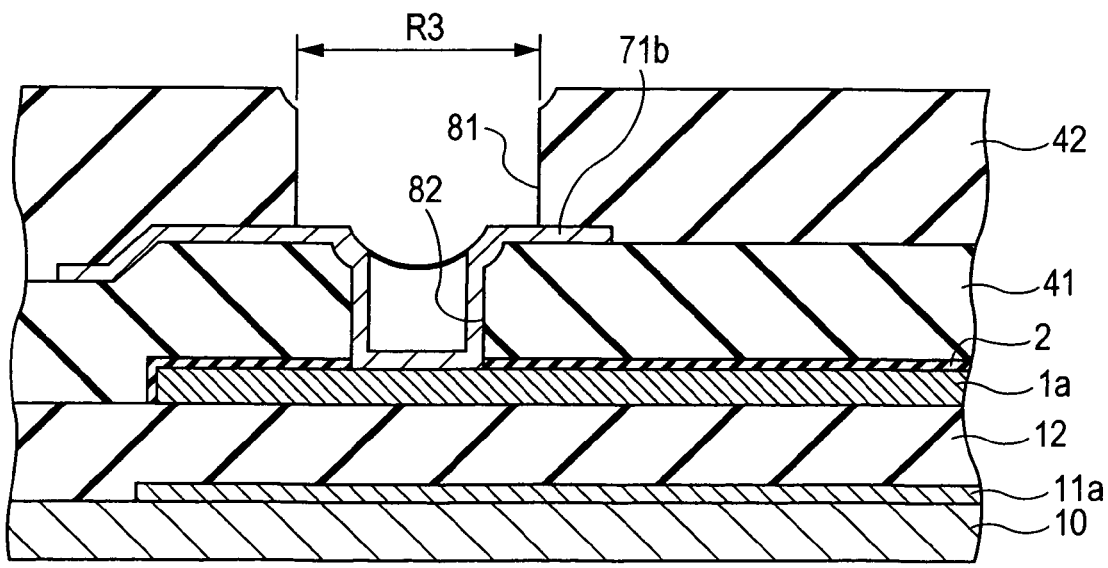

Subsequently, referring to FIG. 9C, the second interlayer insulating layer 42 is formed on the first interlayer insulating layer 41 with a silicate glass film, such as NSG or BPSG, through, for example, a normal pressure or low pressure CVD method, and then, the contact hole 81 is formed to pass through the second interlayer insulating layer 42 to thus reach the surface of the relay layer 71*b* using dry etching or using both dry etching and wet etching. Further, a diameter R3 of the contact hole 81 is, for example, about 2.5 μm.

Here, when the first interlayer insulating layer 41 or the second interlayer insulating layer 42 is made of a BPSG film, a film quality at the interface between the first interlayer insulating layer 41 and the second interlayer insulating layer 42 becomes unstable.

However, when the contact hole 81 that penetrates the second interlayer insulating layer 42 is formed, a hollow at the interface can be prevented by not exposing the wet etchant to the unstable film quality portion of initial deposit of the second interlayer insulating layer 42.

Next, a material film for forming, for example, the data line 6*a* is formed on the surface of the second interlayer insulating layer 42 using sputtering, and patterned by photolithography and etching to form the data line 6*a*.

Next, a manufacturing process of the contact hole 183 for electrically connecting the semiconductor layer 420 to the wiring line 422 in the peripheral region will be described with reference to FIGS. 10 to 13.

Figure 10A:
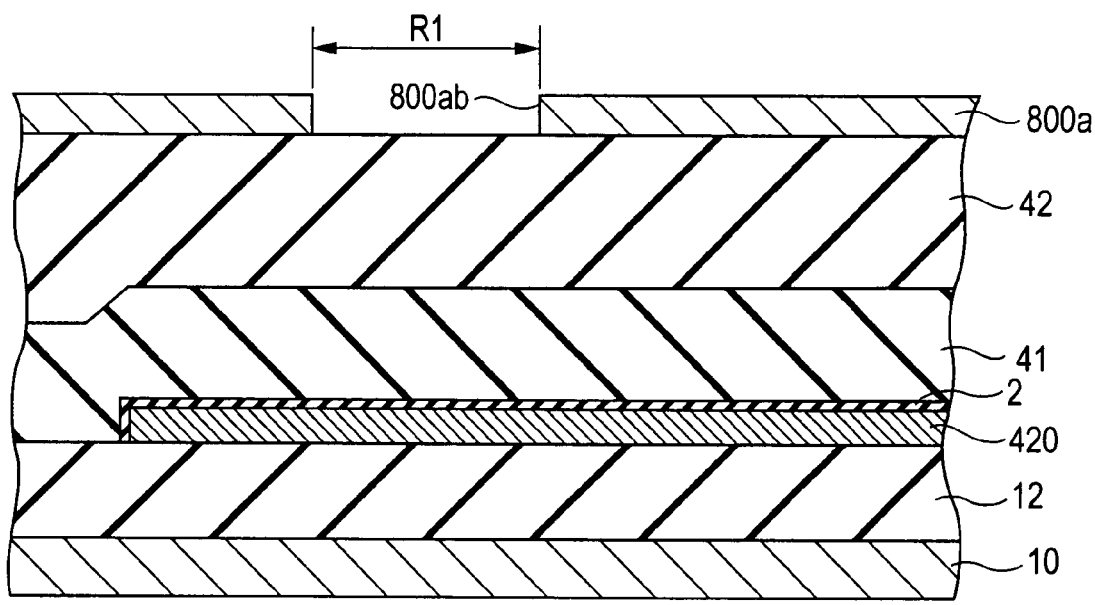
FIG. 10 is a first flow diagram sequentially showing the structure of a cross section shown in FIG. 8 for respective steps of a manufacturing process according to the first embodiment of the invention.

First, referring to FIG. 10A, a base insulating film 12 or a p-channel-type TFT 402*p* and an n-channel-type TFT 402*n* are formed on the TFT array substrate 10, and further, the first interlayer insulating layer 41 and the second interlayer insulating layer 42 are formed on the p-channel-type TFT 402*p* and the n-channel-type TFT 402*n*. Under this state, for example, a resist 800*a* is formed on the second interlayer insulating layer 42 and the resist 800*a* is patterned through photolithography to form an opening 800*ab* at a location corresponding to a formation position of the contact hole 183. Further, a diameter R1 of the opening 800*ab* is, for example, about 4.5 μm.

Figure 10B:
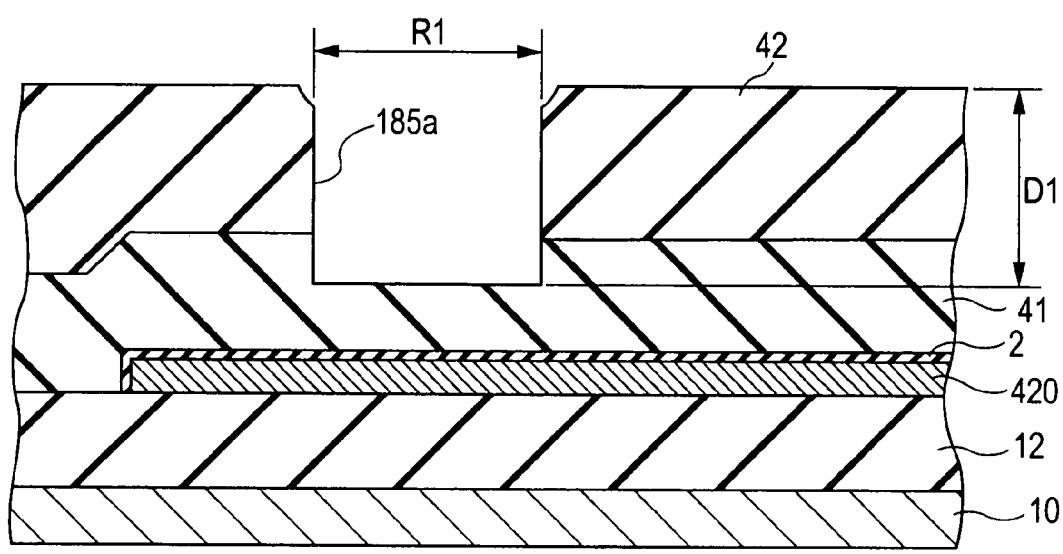

Next, referring to FIG. 10B, a first etching process is conducted to the first interlayer insulating layer 41 and the second interlayer insulating layer 42 via the opening 800*ab* of the resist 800*a* to form the first hole 185*a*. Here, the first etching process is conducted such that an initial hole of the first hole 185*a* is formed through wet etching, and the formed initial hole is further formed through dry etching. Alternatively, the first etching process is conducted through dry etching. The bottom portion of the first hole 185*a* formed as described above is arranged in the first interlayer insulating layer 41, and at the same time, a part of the sidewall of the first hole 185*a* is arranged at the interface between the first interlayer insulating layer 41 and the second interlayer insulating layer 42.

In addition, for the first hole 185*a*, a part of the sidewall located at the interface between the first interlayer insulating layer 41 and the second interlayer insulating layer 42 is formed using dry etching with directivity in a perpendicular direction to the substrate. Therefore, even when the first interlayer insulating layer 41 or the second interlayer insulating layer 42 is formed with a layer having a unstable initial deposit film quality, for example, as the BPSG film, the part of the sidewall located at the interface between the first interlayer insulating layer 41 and the second interlayer insulating layer 42 for the first hole 185*a* can be prevented from being hollowed.

In addition, a diameter of the first hole 185*a* is formed to be, for example, 4.5 μm so as to correspond to a diameter R1 of the opening 800*ab*, and a depth D1 of the First hole 185*a* is formed to be, for example, 1.0 μm by adjusting a processing time for the first etching process. With this, an aspect ratio is about 1/4. Further, according to the present embodiment, the aspect ratio is preferably less than 1/4 to ensure a thickness al of the resist 800*b* for the first hole 185*a*, as described below.

Figure 11A:
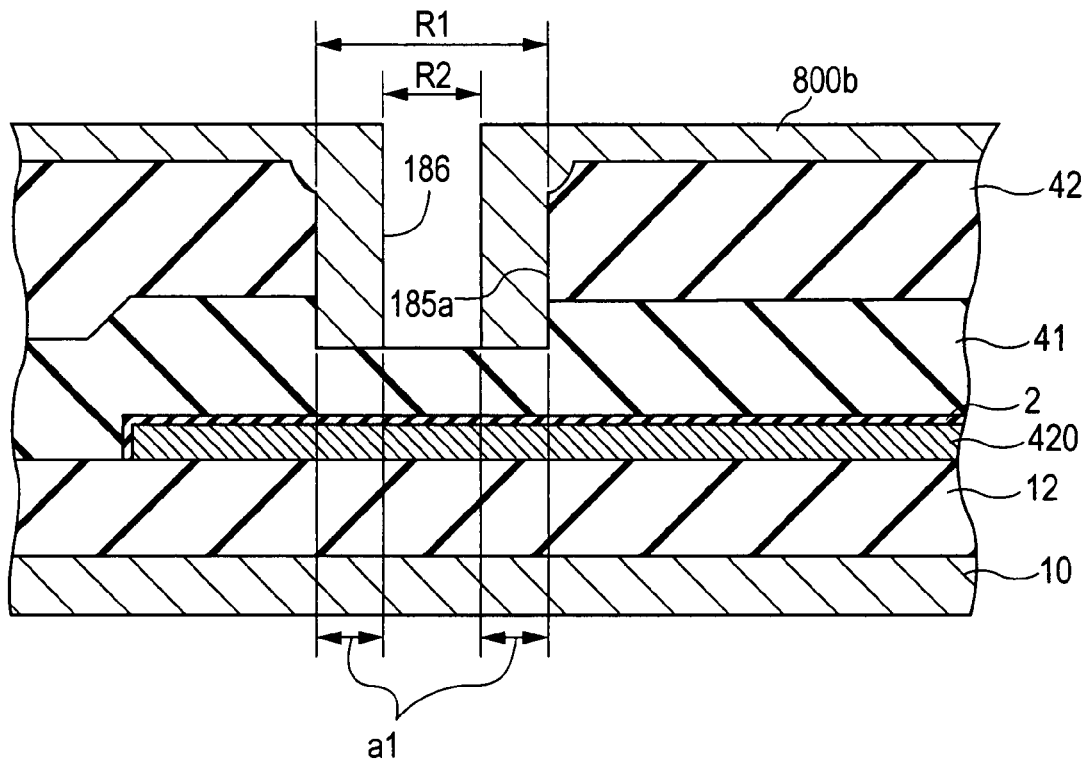
FIG. 11 is a second flow diagram sequentially showing the structure of a cross section shown in FIG. 8 for respective steps of a manufacturing process.

Subsequently, referring to FIG. 11A, the resist 800*b* corresponding to the 'protective film' according to the invention is formed on the surface of the second interlayer insulating layer 42, and the resist 800*b* is patterned using photolithography, so that the small hole 186 is formed from the surface of the resist 800*b* to the bottom of the first hole 185*a*. Further, a diameter R2 of the small hole 186 is, for example, about 1.5 μm.

After forming the small hole 186, in addition to the portion of the sidewall located at the interface between the first interlayer insulating layer 41 and the second interlayer insulating layer 42 for the first hole 185*a*, the surface of the second interlayer insulating layer 42 is covered with the resist 800*b*. Here, by adjusting the aspect ratio upon forming the first hole 185*a* as described above, a thickness al of the resist 800*b* formed in the first hole 185*a* can be ensured to be, for example, 1.75 μm at which it can be prevented that the etchant for the second etching process is soaked deep and thus a hollow is formed at the part of the sidewall located at the interface between the first interlayer insulating layer 41 and the second interlayer insulating layer 42 for the first hole 185*a*. Further, the thickness al of the resist 800*b* is preferably more than 1.0 μm.

Figure 11B:
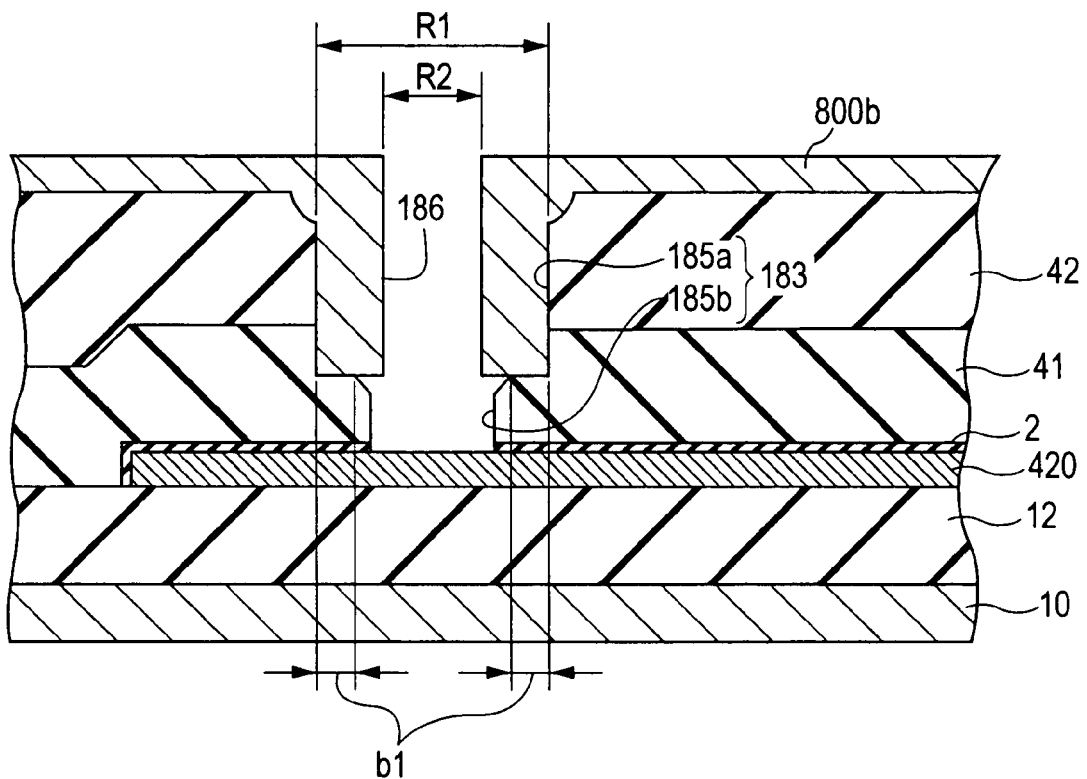

Next, referring to FIG. 11B, the second etching process is conducted to the first interlayer insulating layer 41 using wet etching or using both wet etching and dry etching, so that the second hole 185*b* is formed that penetrates the first interlayer insulating layer 41 and the insulating film 2 from the bottom of the first hole 185*a* exposed in the small hole 186 of the resist 800*b*. With this, the contact hole 183 is formed from the surface of the second interlayer insulating layer 42 to the surface of the semiconductor layer 420 by passing through the second interlayer insulating layer 42 and the first interlayer insulating layer 41.

Here, the second etching process is conducted through wet etching, using, for example, a single wafer processing device.

Alternatively, for example, an initial hole of the second hole 185b is formed using dry etching, and the formed initial hole is further progressed using wet etching to form the second hole 185b. At this time, the part of the sidewall located at the interface between the first interlayer insulating layer 41 and the second interlayer insulating layer 42 for the first hole 185a is protected by the resist 800b. Therefore, even when the first interlayer insulating layer 41 and the second interlayer insulating layer 42 is formed in a layer having a unstable initial deposit film quality, for example, as a BPSG layer, it can be prevented that the etchant is soaked deep into the interface between the first interlayer insulating layer 41 and the second interlayer insulating layer 42 to thus form a hollow at the interface.

In addition, with respect to the second etching process, a processing time using wet etching is preferably adjusted such that the etchant is not soaked deep into the connection portion between the bottom of the first hole 185a and the resist 800b and the connection portion between the sidewall of the first hole 185a and the resist 800b. Furthermore, with the single wafer processing device as described above, it can be more surely prevented that the etchant is soaked deep into the connection portion between the bottom of the first hole 185a and the resist 800b and the connection portion between the sidewall of the first hole 185a and the resist 800b.

In addition, as described above, by adjusting the thickness a1 of the resist 800b formed in the first hole 185a, the bottom of the first hole 185a can be left after the second etching process, by as much as at least a match difference b1 between the small hole 186 and the first hole 185a, generated during a process described with reference to FIG. 11A, which is for example, 0.2 to 0.3 μm.

Figure 12:
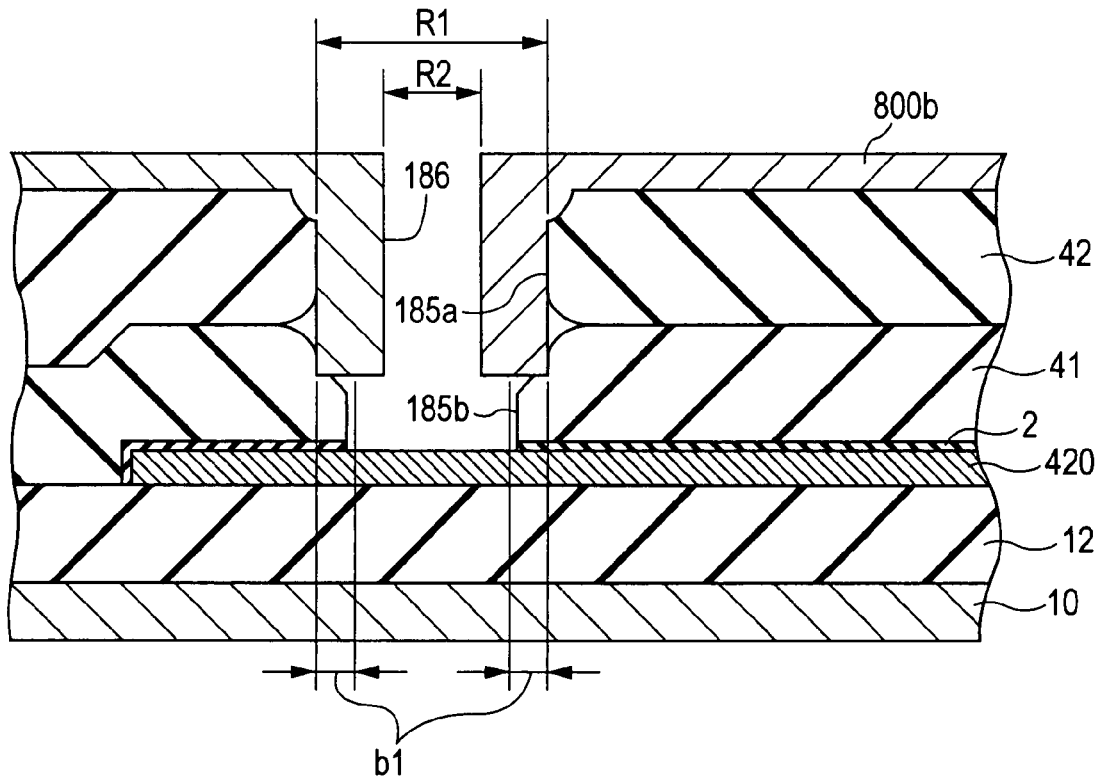
FIG. 12 is a cross-sectional view showing an example of the structure in which a hollow is formed in a first hole after a second etching process.

FIG. 12 shows the structure in a case in which the thickness of the bottom of the first hole 185a is smaller than the above-mentioned value b1, after the second etching process. When the thickness of the bottom of the first hole 185a becomes smaller than the value b1, the etchant is soaked deep from the connection portion between the bottom of the first hole 185a and the resist 800b to the connection portion between the sidewall of the first hole 185a and the resist 800b, and thus, the portion of the sidewall located at the interface between the first interlayer insulating layer 41 and the second interlayer insulating layer 42 for the first hole 185a may be hollowed, as shown in FIG. 12.

Therefore, in addition to adjusting the processing time using wet etching in the second etching process, or using the single wafer processing device, the bottom of the first hole 185a can be determined to be a value b1, so that it is ensured that the hollow is prevented.

The diameter of the second hole shown in FIG. 11b is, for example, about 1.5 μm to correspond to the diameter R2 of the small hole. Here, when the first interlayer insulating layer 41 is made of an NSG layer and the second interlayer insulating layer 42 is made of a BPSG layer, the first interlayer insulating layer 41 has a higher etching rate for wet etching than the second interlayer insulating layer 42. In this case, it is possible to make the diameter of the second hole 185b smaller than the diameter of the first hole 185a.

Figure 13:
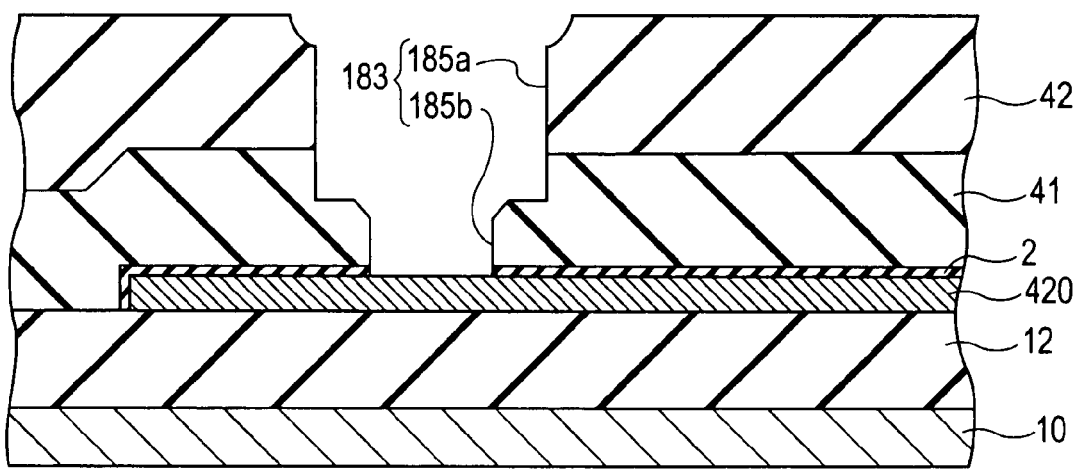
FIG. 13 is a third flow diagram sequentially showing the structure of a cross section shown in FIG. 8 for respective steps of a manufacturing process.

Next, referring to FIG. 13, after removing the resist 800b from the surface of the second interlayer insulating layer 42, a wiring line 422 is formed on the surface of the second interlayer insulating layer 42, like the data line 6a for the pixel unit.

Figure 14:
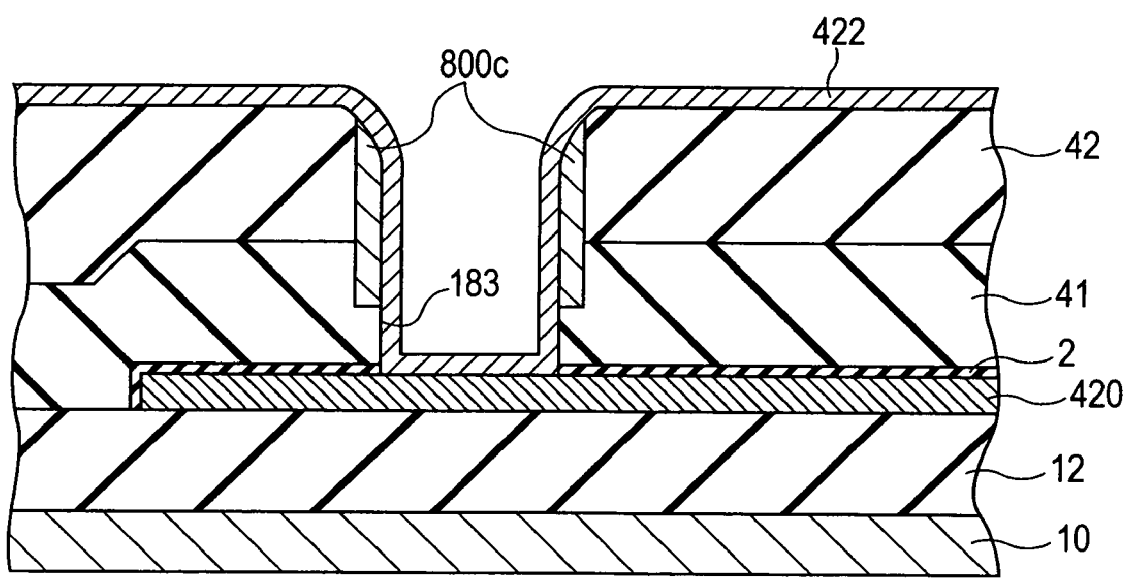
FIG. 14 is a detailed cross-sectional view showing the structure of a contact hole for a peripheral region according to a second embodiment of the invention.

Therefore, as shown in FIG. 14, in the contact hole 183 in a state where the part of the sidewall located at the interface between the first interlayer insulating layer 41 and the second interlayer insulating layer 42 is not hollowed, a part of the wiring line 422 is formed. In addition, with the diameter of the second hole 185b smaller than the diameter of the first hole 185a, the coverage of the wiring line 422 in the contact hole 183 can be improved. Therefore, the disconnection defect of the wiring line 422 in the contact hole 183 can be prevented, and thus a yield for a manufacturing process of an electro-optical device can be improved.

Further, according to the present embodiment, rather than successively forming the wiring line 422 from the contact hole 183 onto the second interlayer insulating layer 42, the wiring line 422 may be formed such that a conductive film is formed in the contact hole 183 to form a plug and the wiring line 422 is connected to the plug.

2: Second Embodiment

Next, an electro-optical device according to a second embodiment of the invention will now be described. Compared to the first embodiment, the electro-optical device according to the second embodiment has the structure different from that of the contact hole 183 described with reference to FIG. 8. Therefore, hereinafter, the structure and a manufacturing method of the electro-optical device are described with reference to FIGS. 14 and 15, focusing on a difference with the first embodiment. Here, FIG. 14 is a detailed cross-sectional view showing the structure of a contact hole 183 for a peripheral region; and FIG. 15 is a flow diagram sequentially showing the structure of a cross section shown in FIG. 14 for respective steps of a manufacturing process. Further, the same constituent elements of the second embodiment as those of the first embodiment are denoted by the same reference numerals and the repeated description thereof will be omitted.

According to the second embodiment, the contact hole 183 is formed according to a manufacturing method, which will be described in detail later, so that a protective film 800c to protect the interface between the first interlayer insulating layer 41 and the second interlayer insulating layer 42 is left at the sidewall of the contact hole 183, as shown in FIG. 14. The protective film 800c is made of, for example, an oxide film, a polysilicon film, or a nitride film.

Next, a method of manufacturing the electro-optical device according to the second embodiment will be described with reference to FIG. 15.

Figure 15A:
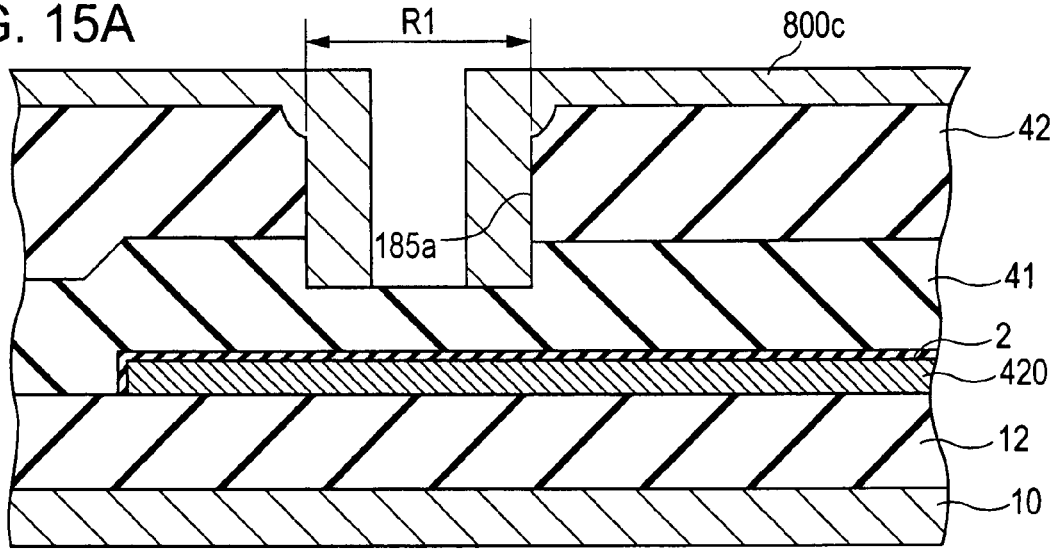
FIG. 15 is a flow diagram sequentially showing the structure of a cross section shown in FIG. 14 for respective steps of a manufacturing process of the second embodiment of the invention.

Referring to FIG. 15A, in the state where the first hole 185a is formed in the first interlayer insulating layer 41 and the second interlayer insulating layer 42, the protective film 800c is formed on the surface of the second interlayer insulating layer 42.

Figure 15B:
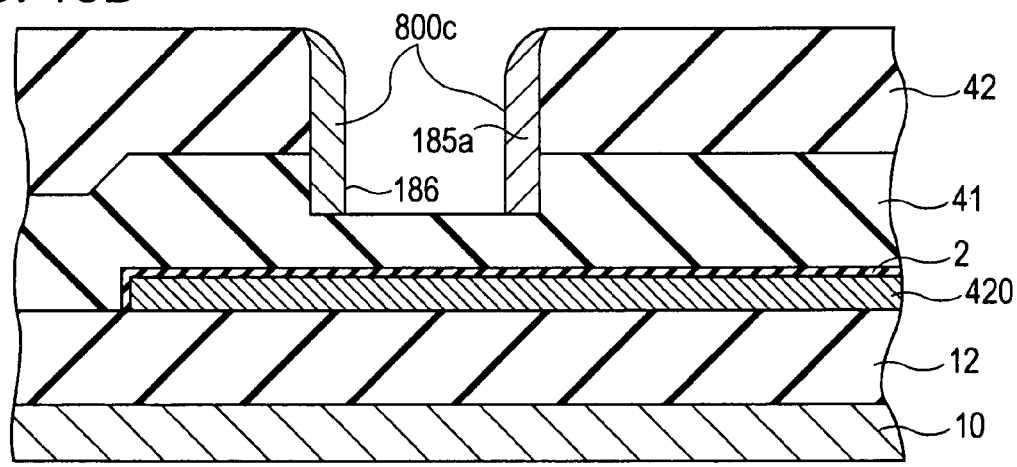

Subsequently, referring to FIG. 15B, the small hole 186 is formed from the surface of the protective film 800c to the bottom of the first hole 185a, by etching the protective film 800c all over the surface using dry etching having directivity in a direction perpendicular to the substrate surface.

Figure 15C:
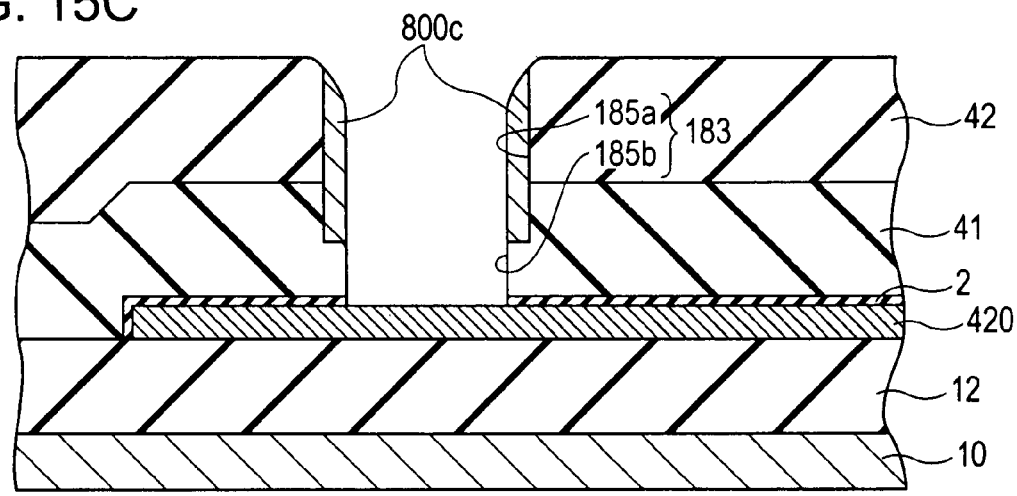

Next, referring to FIG. 15C, the second etching process is conducted to the first interlayer insulating layer 41 using wet etching, the second hole 185b is formed that penetrates the first interlayer insulating layer 41 and the insulating film 2 from the bottom of the first hole 185a exposed in the small hole 186 of the protective film 800c. Further, as shown in FIGS. 15B and 15C, the sidewall of the protective film 800c formed in the first hole 185a is recessed toward the first hole 185a, using the overall etching and the second etching process.

Here, compared to the resist 800b, the sidewall and the bottom of the first hole 185a and the protective film 800c have good adhesiveness. Therefore, when the second hole 185b is formed, it can be guaranteed that the etchant is prevented from being soaked deep from the connection portion between the bottom of the first hole 185*a* and the protective film 800*c* to the connection portion between the sidewall of the first hole 185*a* and the protective film 800*c*. Therefore, it can be prevented that the etchant is soaked deep into the part of the sidewall located at the interface between the first interlayer insulating layer 41 and the second interlayer insulating layer 42 for the first hole 185*a* to thus form a hollow in the interface.

Subsequently, the wiring line 422 is successively formed from the contact hole 183 to the protective film 800*c*. Therefore, since the process ends without removing the protective film 800*c*, the number of processing in a manufacturing process of the electro-optical device can be reduced.

3: Electronic Apparatus

Next, a case where a liquid crystal device serving as the above-mentioned electro-optical device is adapted to various electronic apparatuses will be described.

3-1: Projector

Figure 16:
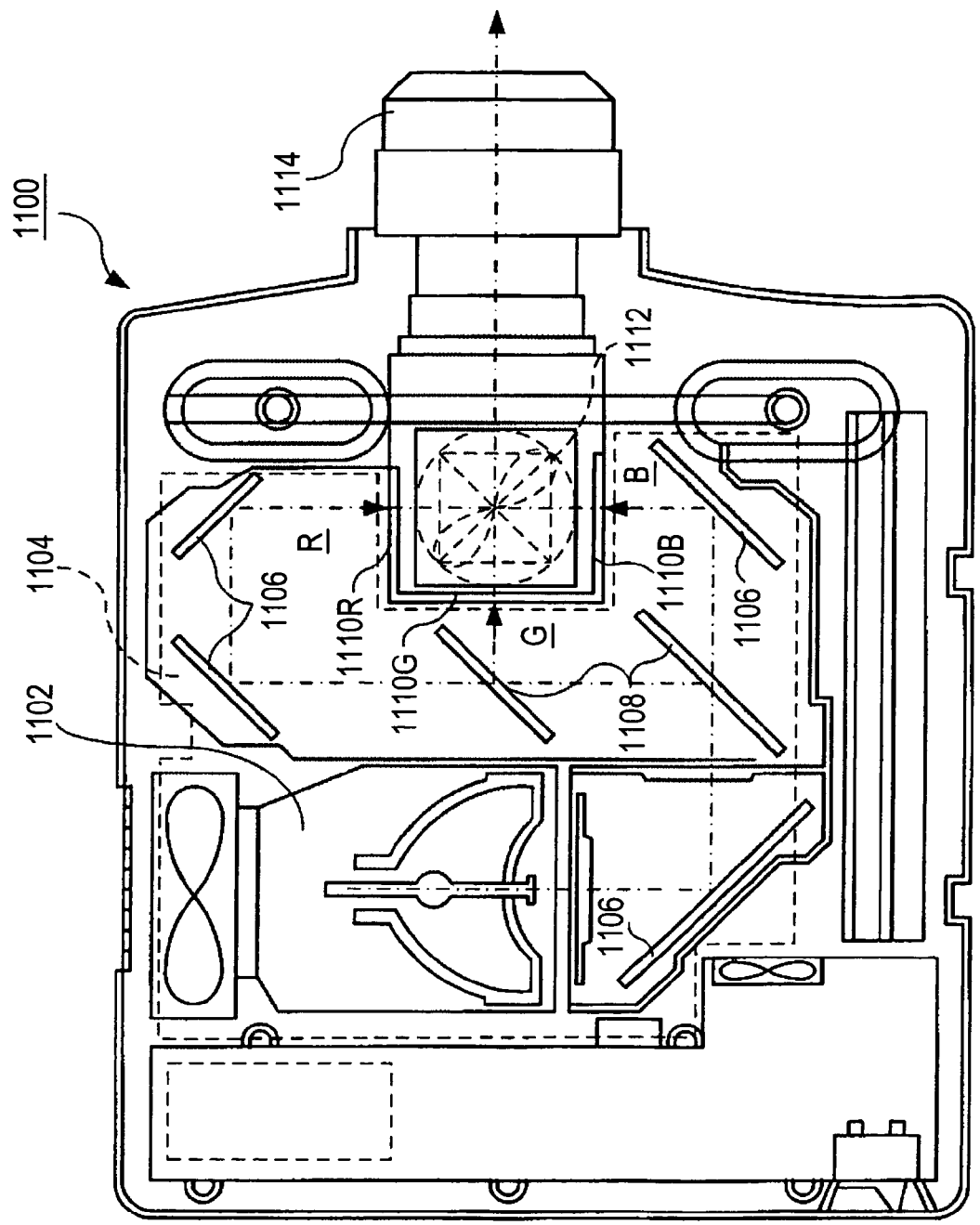
FIG. 16 is a plan view showing the structure of a projector that is an example of an electronic apparatus to which a liquid crystal device is applied.

First, a projector using the liquid crystal device as a light valve is described. FIG. 16 is a plan view showing an example of the structure of a projector. As shown in FIG. 16, a lamp unit 1102 made of a white light source, such as a halogen lamp, is arranged in a projector 1100. Transmission light emitted from the lamp unit 1102 is divided into three primary colors, i.e., R (red), G (green), and B (blue), by four mirrors 1106 and two dichroic mirrors 1108 arranged in a light guide 1104, and incident on liquid crystal panels 1110R, 1110B, and 1110G serving as light valves corresponding to the respective primary colors.

The liquid crystal panels 1110R, 1110B, and 1110G have the same structure as that of the above-mentioned liquid crystal device, and are driven by signals of the R, G, and B primary colors supplied from an image signal processing circuit. Further, light modulated by the liquid crystal panel is incident on a dichroic prism 1112 in three directions. In the dichroic prism 1112, R and B light components are refracted by 90 degrees while a G light component travels straight. Therefore, as a result of synthesizing the respective colored images, a color image is projected on a screen via a projecting lens 1114.

Here, focusing on display images from the respective liquid crystal panels 1110R, 1110B, and 1110G, it is necessary that the display image from the liquid crystal panel 1110G be horizontally inverted against the display images from the liquid crystal panels 1110R and 1110B.

Moreover, since light corresponding to the respective primary colors, R, G, and B is incident on the liquid crystal panels 1110R, 1110B and 1110G by the dichroic mirrors 1108, it is not necessary that a color filter be provided.

3-2: Mobile Computer

Figure 17:
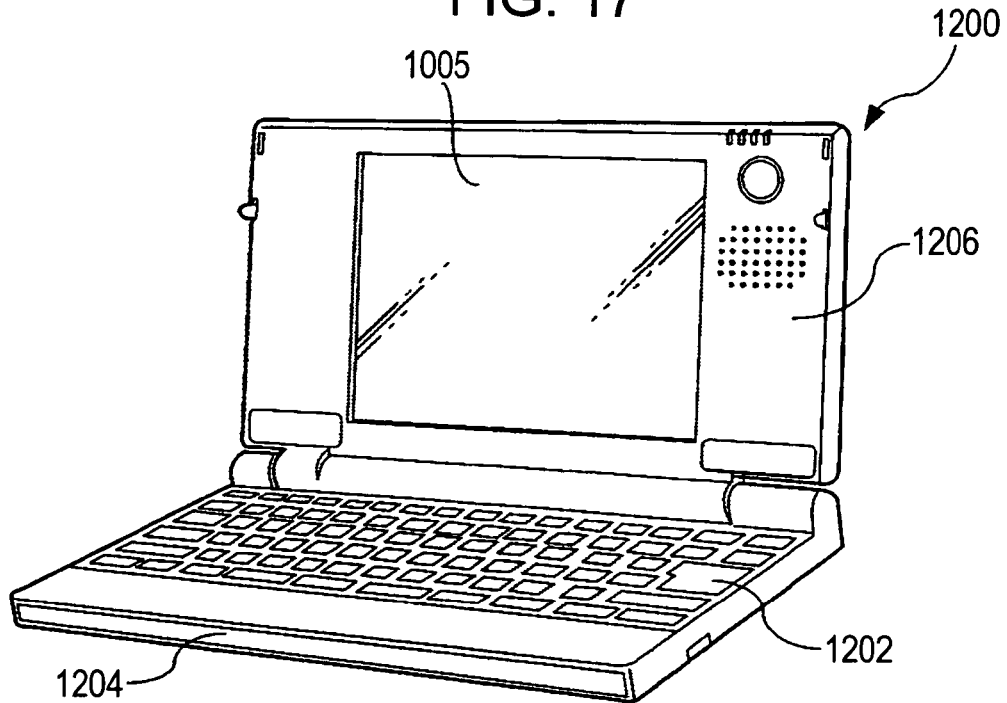
FIG. 17 is a perspective view showing the structure of a personal computer that is an example of an electronic apparatus to which a liquid crystal device is applied.

Next, a case where the liquid crystal display is adapted to a mobile-type personal computer will be described. FIG. 17 is a perspective view showing the structure of the personal computer. In FIG. 17, a computer 1200 includes a main body 1204 having a keyboard 1202, and a liquid crystal display unit 1206. The liquid crystal display unit 1206 is arranged by adding a backlight unit to the rear side of the above-described liquid crystal device 1005.

3-3: Cellular Phone

Figure 18:
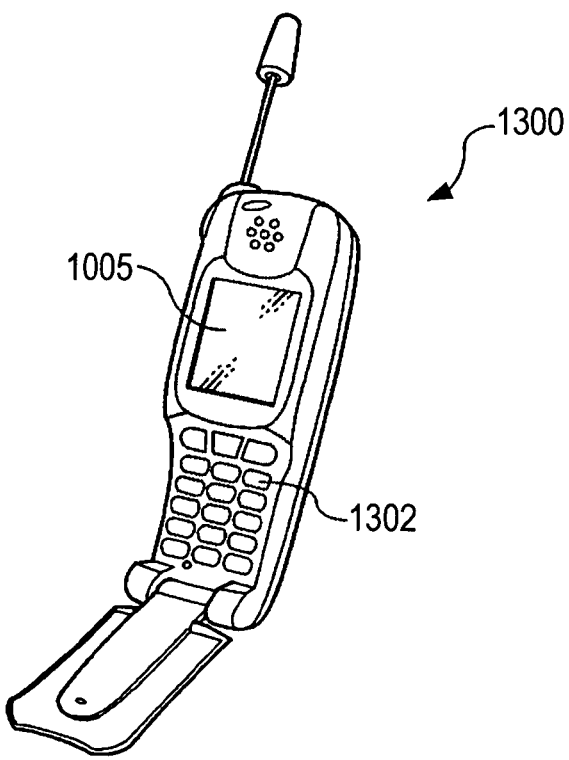
FIG. 18 is a perspective view showing the structure of a cellular phone that is an example of an electronic apparatus to which a liquid crystal device is applied.

Further, an example where the liquid crystal device is adapted to a cellular phone is described. FIG. 18 is a perspective view showing the structure of the cellular phone. In FIG. 18, a cellular phone 1300 includes a plurality of operation buttons 1302 and a reflective liquid crystal device 1005. For the reflective liquid crystal device 1005, a front light valve is arranged on a front surface, if necessary.

Further, in addition to the electronic apparatuses described with reference to FIGS. 16 to 18, there may be provided a liquid crystal TV, a view-finder-type or monitor-direct-view-type video tape recorder, a car navigation device, a pager, an electronic note, a calculator, a word processor, a workstation, a video phone, a POS terminal, and an apparatus having a touch panel. In addition, it is needless to say that the invention can be applied to these various apparatuses.

The invention is not limited to the above-mentioned embodiments, and various changes and modifications can be made without departing from the spirit and scope of the invention, read by claims and the overall specifications. The invention also includes a semiconductor device accompanying such changes and modifications and a manufacturing method thereof, an electro-optical device having the semiconductor device and a manufacturing method thereof, and an electronic apparatus having the electro-optical device.

What is claimed is:

1. A method of manufacturing a semiconductor device comprising:

forming a first conductive layer above a substrate;

forming a first interlayer insulating layer over the first conductive layer;

forming a second interlayer insulating layer on the first interlayer insulating layer;

dry etching a first hole through the second interlayer insulating layer, beyond an interface between the first and the second interlayer insulating layers, to reach the first interlayer insulating layer;

forming a protective film that covers a top surface of the second interlayer insulating layer and surfaces inside the first hole;

removing the protective film formed at a bottom of the first hole, while maintaining the protective film that covers the top surface and sidewall in the first hole of the second interlayer insulating layer, and maintaining the protective film that covers the sidewall in the first hole of the first interlayer insulating layer, thereby forming a small hole in the protective film within the first hole;

etching a second hole, via the small hole in the protective film, through the first interlayer insulating layer to the first conductive layer, thereby forming a contact hole including the first and second holes, a diameter of the second hole being smaller than a diameter of the first hole;

removing the protective film that covers the surface of the second interlayer and the sidewall of the first and the second interlayer insulating layers;

forming a second conductive layer over the second interlayer insulating layer and in the contact hole; and electrically connecting the first conductive layer and the second conductive layer via the contact hole.

2. The method of manufacturing a semiconductor device according to claim 1, wherein forming the protective film includes forming resist as the protective film; and forming the contact hole includes removing the resist after the forming of the second hole.

3. The method of manufacturing a semiconductor device according to claim 1, wherein forming the first hole is performed using only dry etching or both dry etching and wet etching.

4. The method of manufacturing a semiconductor device according to claim 1,
wherein forming the first hole is conducted by controlling a diameter and a depth of the first hole such that a ratio of a diameter at an edge of the first hole to a depth of the first hole has an aspect ratio of 1/4 or less.

5. The method of manufacturing a semiconductor device according to claim 1,
wherein forming the protective film includes forming in the first hole a small hole having a diameter smaller than a diameter at an edge of the first hole from a surface of the protective film to a bottom of the first hole; and
forming the contact hole includes forming the second hole such that the second hole penetrates the first interlayer insulating layer from a surface of the bottom of the first hole exposed to the small hole.

6. The method of manufacturing a semiconductor device according to claim 1,
wherein during forming the contact hole, the second hole is formed such that of a bottom of the first hole, only a position difference between the small hole and the first hole remains.

7. The method of manufacturing a semiconductor device according to claim 1,
wherein during forming the contact hole, when the second hole is formed, wet etching is conducted using a single wafer processing device.

8. The method of manufacturing a semiconductor device according to claim 1,
wherein during forming the contact hole, when the second hole is formed, wet etching and dry etching are used as an etching method.

9. The method of manufacturing a semiconductor device according to claim 1,
wherein during forming the first and second interlayer insulating layers, respectively, the first interlayer insulating layer is made of a material having a relatively high etching rate for wet etching used when forming the second hole with a process of forming the contact hole, compared to the second interlayer insulating layer.

10. The method of manufacturing a semiconductor device according to claim 1,
wherein forming the first and second conductive layers includes:
forming a semiconductor layer of a thin film transistor serving as the first conductive layer;
forming a gate insulating film of the thin film transistor on the semiconductor layer, and then, forming a gate electrode of the thin film transistor on the gate insulating film; and
forming a wiring line electrically connected to the semiconductor layer for serving as the second conductive layer.

11. A method of manufacturing an electro-optical device using the method of manufacturing a semiconductor device according to claim 10, the method comprising:
forming a plurality of pixel units in an image display region above the substrate; and
forming a driving circuit for driving the plurality of pixel units, by forming a plurality of the semiconductor devices in a peripheral region located around the image display region.

12. An electro-optical device manufactured by the method of manufacturing an electro-optical device according to claim 11.

13. An electronic apparatus having the electro-optical device according to claim 12.

14. A semiconductor device manufactured by the method of manufacturing a semiconductor device according to claim 1.

* * * * *